(12) United States Patent
Kuang et al.

(10) Patent No.: US 12,424,156 B1
(45) Date of Patent: Sep. 23, 2025

(54) DISPLAY PANEL AND DISPLAY DEVICE

(71) Applicant: Xiamen Tianma Display Technology Co., Ltd., Xiamen (CN)

(72) Inventors: Jian Kuang, Xiamen (CN); Yana Gao, Xiamen (CN); Xingyao Zhou, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/930,063

(22) Filed: Oct. 29, 2024

(30) Foreign Application Priority Data

Jul. 25, 2024 (CN) .......................... 202411013008.1

(51) Int. Cl.
*G09G 3/32* (2016.01)
*G11C 19/28* (2006.01)

(52) U.S. Cl.
CPC ............. *G09G 3/32* (2013.01); *G11C 19/287* (2013.01); *G09G 2300/0819* (2013.01); *G09G 2300/0842* (2013.01); *G09G 2300/0861* (2013.01); *G09G 2310/0267* (2013.01); *G09G 2310/0286* (2013.01); *G09G 2310/04* (2013.01); *G09G 2310/08* (2013.01); *G09G 2320/0252* (2013.01); *G09G 2340/0435* (2013.01)

(58) Field of Classification Search
CPC ............. G09G 3/32; G09G 2300/0819; G09G 2300/0842; G09G 2300/0861; G09G 2310/0267; G09G 2310/0286; G09G 2310/04; G09G 2310/08; G09G 2320/0252; G09G 2340/0435; G11C 19/287

See application file for complete search history.

(56) References Cited

U.S. PATENT DOCUMENTS 12,322,355 B1\* 6/2025 Wang ..................... G09G 3/32
2024/0265873 A1\* 8/2024 Chen .................... H10D 86/425

\* cited by examiner

*Primary Examiner* — Andrew Sasinowski
(74) *Attorney, Agent, or Firm* — Anova Law Group, PLLC

(57) ABSTRACT

A shift register unit includes a driving control module configured to receive an input signal and control a signal of a first output node and a signal of a second output node, a stage transfer module configured to receive a signal of a first output node and a signal of a second output node and control a stage transfer signal, a transmission control module configured to receive a stage transfer signal and a transmission control signal and control a signal of a third output node, an auxiliary control module configured to receive a signal of a second output node, a signal of a third output node and an auxiliary control signal and control a signal of a fourth output node, and a scanning module configured to receive at least a signal of a third output node and a signal of a fourth output node and control a scanning signal.

36 Claims, 21 Drawing Sheets

DISPLAY PANEL AND DISPLAY DEVICE

CROSS-REFERENCE TO RELATED APPLICATION

The present application claims priority of Chinese Patent Application No. 202411013008.1, filed on Jul. 25, 2024, the entire content of which is hereby incorporated by reference.

TECHNICAL FIELD

The present application relates to the field of display technology, in particular to a display panel and a display device.

BACKGROUND

With the development of display technology, the application scenarios of display devices are increasing, and users' display requirements for display devices are becoming more and more diverse. In order to meet users' requirements for the simultaneous display of multiple application scenarios by end products, some interfaces on display screens need to be displayed at a high frequency to ensure the smoothness of the picture, and some interfaces need to be displayed at a low frequency to reduce product power consumption.

At present, display devices can implement zoned and frequency-controlled display by controlling the scanning signal output by the driving circuit during the display time of one picture frame, to provide valid pulses of the scanning signal to pixels in high-frequency display areas, and to stop providing valid pulses of the scanning signal to pixels in low-frequency display areas.

However, when the driving circuit does not output a valid pulse of the scanning signal for a long time, the scanning signal may fluctuate, thereby affecting the display effect.

SUMMARY

The present disclosure provides a display panel and a display device to improve the stability of scanning signals.

One aspect of the present disclosure provides a display panel, and the display panel includes a driving circuit including a plurality of cascaded shift register units, where a shift register unit includes a driving control module, a stage transfer module, a transmission control module, an auxiliary control module and a scanning module, where: the driving control module is configured to receive at least an input signal and control a signal of a first output node and a signal of a second output node; the stage transfer module is configured to receive at least the signal of the first output node and the signal of the second output node, and control a stage transfer signal, where a stage transfer signal of an i-th stage shift register unit is multiplexed as an input signal of a j-th stage shift register unit, where i≠j, and i and j are both positive integers; the transmission control module is configured to receive at least the stage transfer signal and a transmission control signal, and control a signal of a third output node; the auxiliary control module is configured to receive at least the signal of the second output node, the signal of the third output node and an auxiliary control signal, and control a signal of a fourth output node; and the scanning module is configured to receive at least the signal of the third output node and the signal of the fourth output node, and control a scanning signal.

Another aspect of the present disclosure provides a display device. The display device includes a display panel, and the display panel includes a driving circuit including a plurality of cascaded shift register units, where a shift register unit includes a driving control module, a stage transfer module, a transmission control module, an auxiliary control module and a scanning module, where: the driving control module is configured to receive at least an input signal and control a signal of a first output node and a signal of a second output node; the stage transfer module is configured to receive at least the signal of the first output node and the signal of the second output node, and control a stage transfer signal, where a stage transfer signal of an i-th stage shift register unit is multiplexed as an input signal of a j-th stage shift register unit, where i≠j, and i and j are both positive integers; the transmission control module is configured to receive at least the stage transfer signal and a transmission control signal, and control a signal of a third output node; the auxiliary control module is configured to receive at least the signal of the second output node, the signal of the third output node and an auxiliary control signal, and control a signal of a fourth output node; and the scanning module is configured to receive at least the signal of the third output node and the signal of the fourth output node, and control a scanning signal.

Other aspects of the present disclosure may be understood by those skilled in the art in light of the description, the claims, and the drawings of the present disclosure.

BRIEF DESCRIPTION OF THE DRAWINGS

In order to more clearly illustrate the technical solutions of the embodiments of the present disclosure, the drawings required for use in the embodiments will be briefly introduced below. Apparently, the drawings described below are only some embodiments of the present disclosure. For persons having ordinary skills in the art, other drawings may be obtained based on these drawings without making creative efforts.

DETAILED DESCRIPTION

In order to enable persons skilled in the art to better understand the present disclosure, the technical solutions in embodiments of the present disclosure will be described in detail below in conjunction with the accompanying drawings in embodiments of the present disclosure. Apparently, the specific embodiments described herein are only to explain the present disclosure and not to limit the present disclosure. Based on embodiments of the present disclosure, all other embodiments obtained by persons having ordinary skills in the art without making creative efforts shall fall within the scope of protection of the present disclosure.

It should be noted that in this disclosure, relational terms, such as "first" and "second", are only used to distinguish one entity or operation from another entity or operation, and do not necessarily require or imply one of these entities or operations to have any such actual relationship or order between. Moreover, the terms "include", "contain" or any other variants thereof are intended to cover a non-exclusive inclusion. Exemplarily, a process, method, system, product or equipment that includes a series of steps or elements is not necessarily limited to those steps or elements that are explicitly listed but may include steps or elements that are not explicitly listed or those that are inherent to the process, method, system, product or equipment.

Based on embodiments of the present disclosure, all other embodiments obtained by persons having ordinary skills in the art without making creative efforts shall fall within the scope of protection of the present disclosure. The technical solutions in embodiments of the present disclosure will be described in detail below in conjunction with the accompanying drawings in embodiments of the present disclosure.

Figure 1:
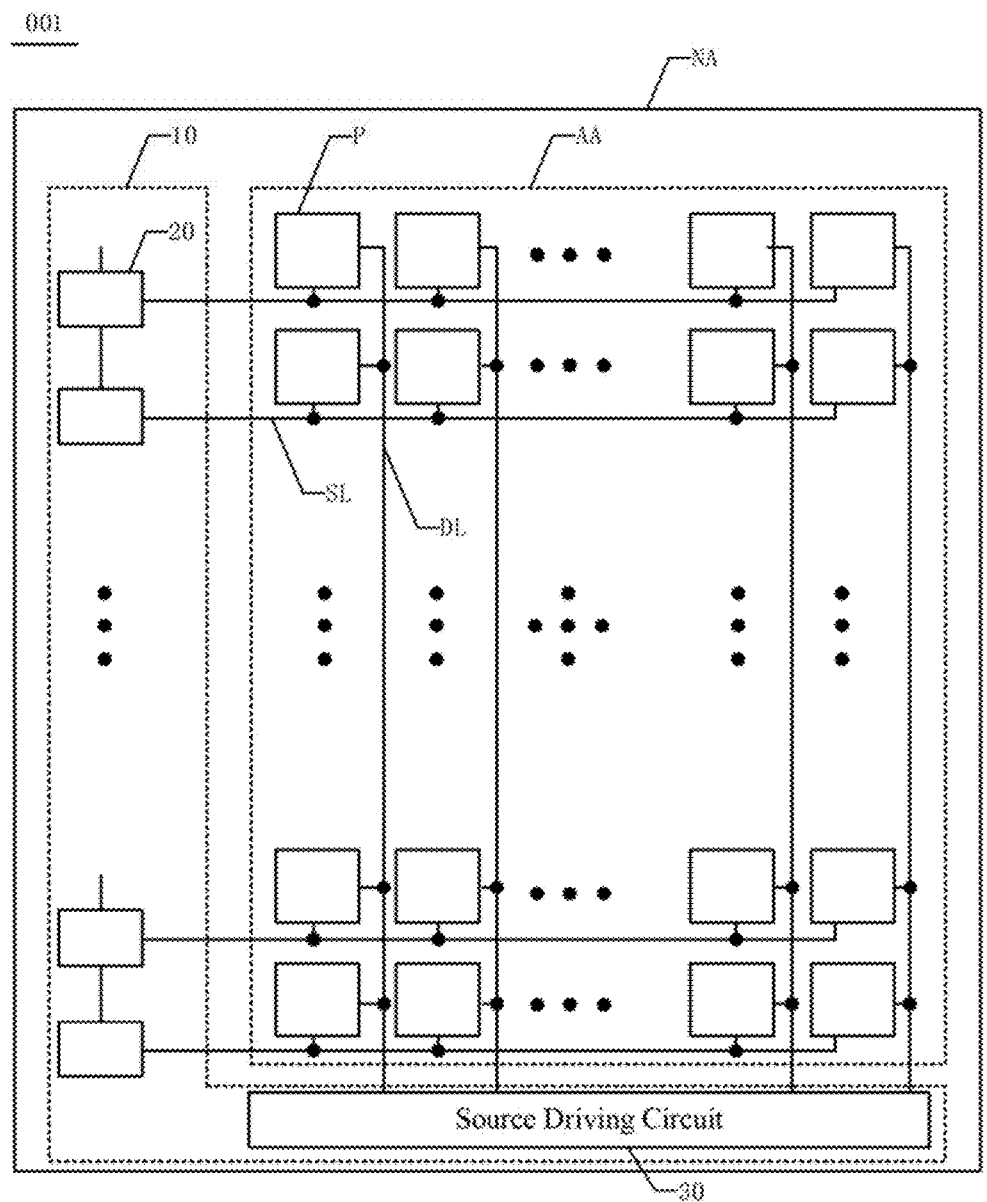
FIG. 1 is a schematic diagram of a top view of a display panel in accordance with an embodiment of the present disclosure.

FIG. 1 is a schematic diagram of a top view of a display panel in accordance with an embodiment of the present disclosure. Refer to FIG. 1, a display panel 001 includes a driving circuit 10, a plurality of scan lines SL, a plurality of data lines DL, and a plurality of pixels P located in a display area AA. At least some of the pixels P located in the same row can be electrically connected to a same scan line SL, and at least some of the pixels P located in the same column can be electrically connected to a same data line DL.

The driving circuit 10 includes a plurality of cascaded shift register units 20, where a first level shift register unit 20 can receive a start signal as an input signal. Starting from a second level, an input signal of the shift register unit 20 of each level can come from the previous level's shift register unit 20 but is not limited to the previous level's shift register unit 20. In at least part of display frames, a scanning signal output by the shift register unit 20 of each level can be shifted in sequence, and the shift register unit 20 is electrically connected to at least one scan line SL to provide a scanning signal for the scan line SL. Exemplarily, when the scanning signal transmitted on the scan line SL is at a valid level, a switching device in a row of pixels P electrically connected to the scan line SL can be controlled to be turned on, so that the row of pixels P electrically connected to the scan line SL can receive a data signal transmitted on the data line DL and display a corresponding grayscale according to the data signal, so as to implement a refresh of the pixels P electrically connected to the scan line SL.

The display panel 001 may include an LED display and the pixel P may include a write transistor, a driving transistor, a storage capacitor, a light-emitting element LED, etc. (not shown in FIG. 1); or the display panel 001 may include a liquid crystal display and the pixel P may include a write transistor, a liquid crystal capacitor, a storage capacitor, a pixel electrode and a common electrode, etc. (not shown in FIG. 1). Embodiments of the present disclosure do not specifically limit the type of display panel and the specific structure of the pixel P.

In an embodiment, the driving circuit 10 further includes a source driving circuit 30, and the source driving circuit 30 in the driving circuit 10 is electrically connected to a plurality of data lines DL to provide data signals for the data lines DL. Exemplarily, at the pixel refresh time of a row of pixels P, the source driving circuit 30 can provide a plurality of data signals for the plurality of data lines DL, so that the row of pixels P can display corresponding grayscales according to the data signals provided by the source driving circuit 30. At the pixel refresh time of a next row of pixels P, the source driving circuit 30 can re-provide a plurality of data signals for the plurality of data lines DL, so that the next row of pixels P can display corresponding grayscales according to the data signals re-provided by the source driving circuit 30, so as to implement row-by-row refresh of pixels P in the display panel 001.

It should be noted that FIG. 1 only exemplarily shows that the driving circuit 10 is located in a non-display area NA outside the display area AA. In some embodiments, the driving circuit 10 may also be located in the display area AA. In addition, FIG. 1 only exemplarily shows that the shift register unit 20 is located on the left and bottom sides of the display area AA. In some embodiments, the driving circuit 10 may also be located on other sides of the display area AA, or simultaneously located on one side, three sides, four sides, etc. of the display area AA. Embodiments of the present disclosure do not limit the position of the driving circuit 10.

It should also be noted that FIG. 1 only exemplarily shows a partial structure and a partial signal routing of the display panel 001. In some embodiments, the display panel 001 may also include other structures and other signal routings, which are not limited by the embodiments of the present disclosure.

Figure 2:
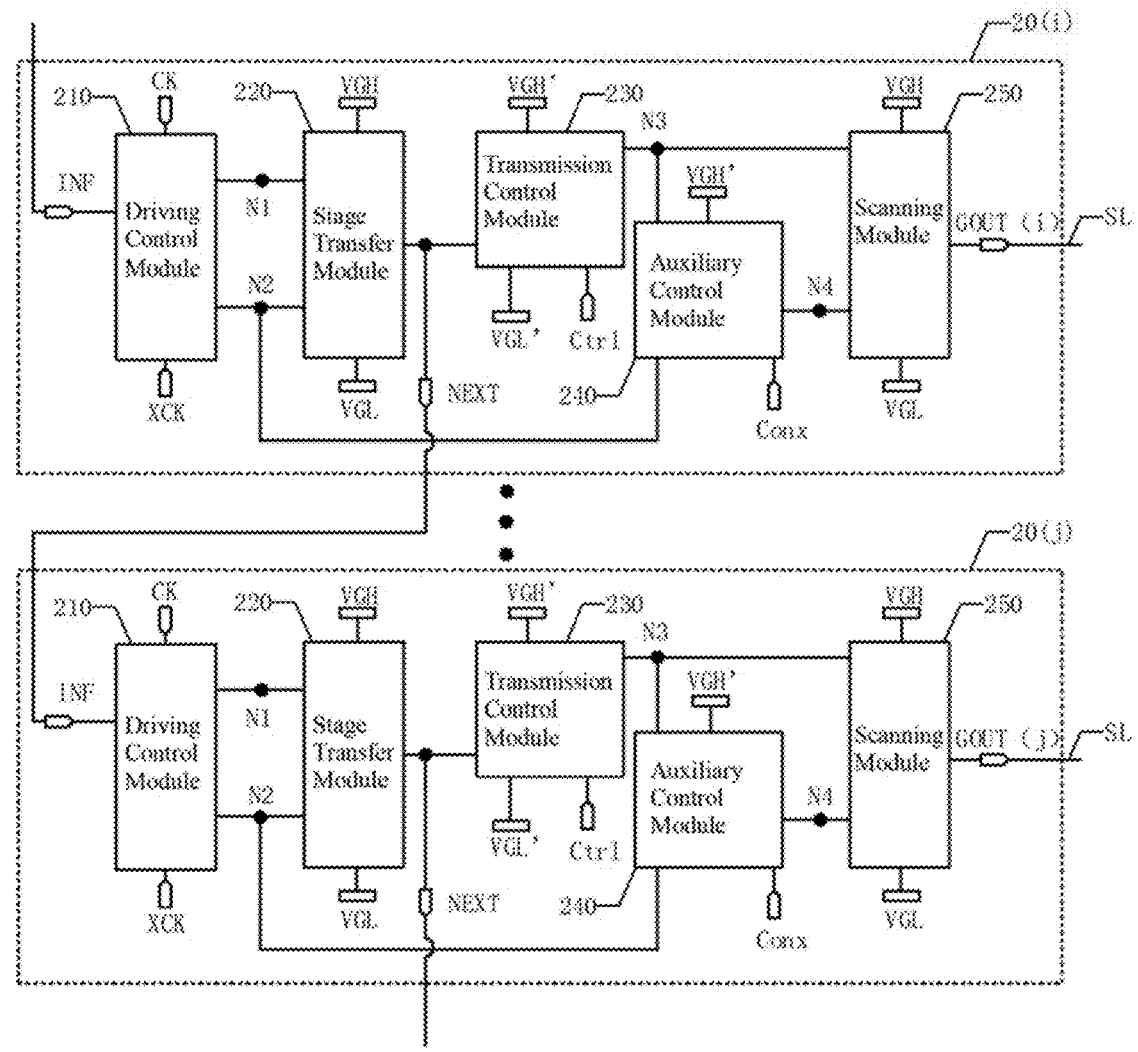
FIG. 2 is a schematic diagram of a shift register unit in accordance with an embodiment of the present disclosure.

FIG. 2 is a schematic diagram of a shift register unit in accordance with an embodiment of the present disclosure. Refer to FIG. 2, a shift register unit 20 includes a driving control module 210, a stage transfer module 220, a transmission control module 230, an auxiliary control module 240 and a scanning module 250. The driving control module 210 is configured to receive at least an input signal INF, and control a signal of a first output node N1 and a signal of a second output node N2. The stage transfer module 220 is configured to receive at least the signal of the first output node N1 and the signal of the second output node N2, and control a stage transfer signal NEXT where the stage transfer signal NEXT of an i-th stage shift register unit 20(i) is multiplexed as the input signal INF of a j-th stage shift register unit 20(j), where i≠j, and i and j are both positive integers. In an embodiment, j=i+1. The transmission control module 230 is configured to receive at least the stage transfer signal NEXT and a transmission control signal Ctrl, and control a signal of a third output node N3. The auxiliary control module 240 is configured to receive at least the signal of the second output node N2, the signal of the third output node N3 and an auxiliary control signal Conx, and control a signal of a fourth output node N4. The scanning module 250 is configured to receive at least the signal of the third output node N3 and the signal of the fourth output node N4, and control a scanning signal GOUT.

Figure 3:
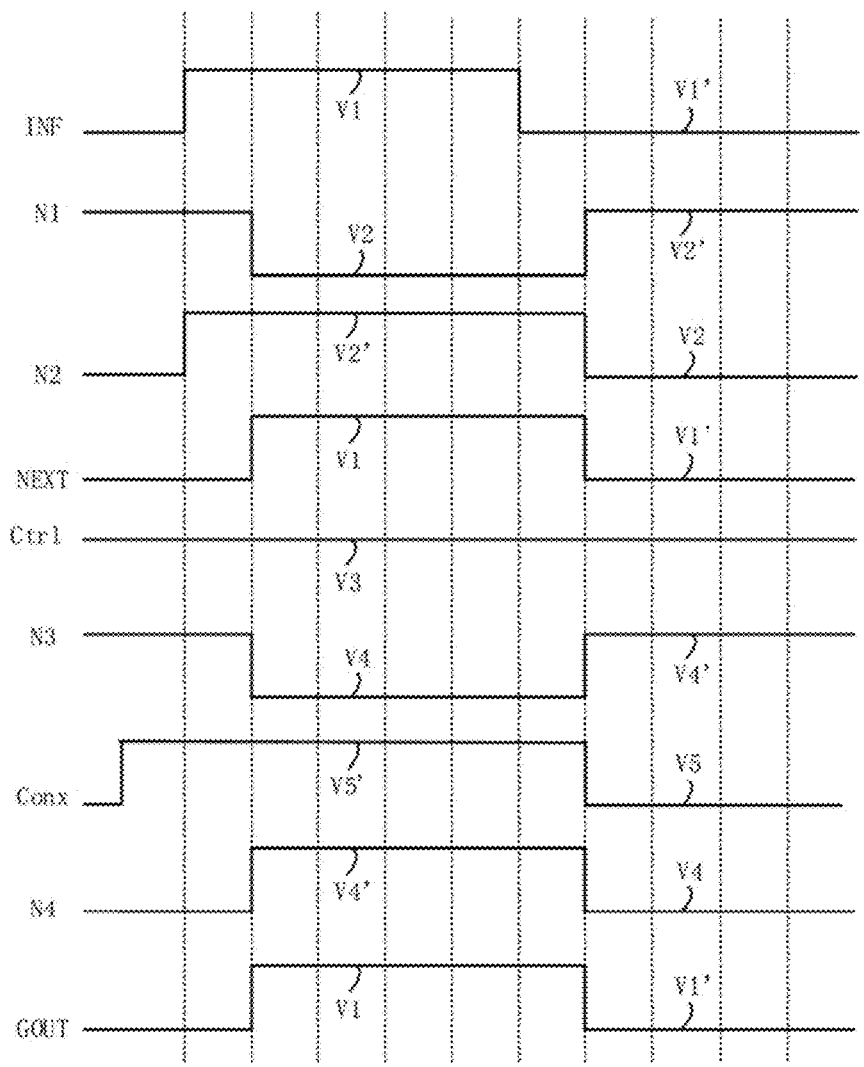
FIG. 3 is a timing diagram of a shift register unit in accordance with an embodiment of the present disclosure.
Figure 4:
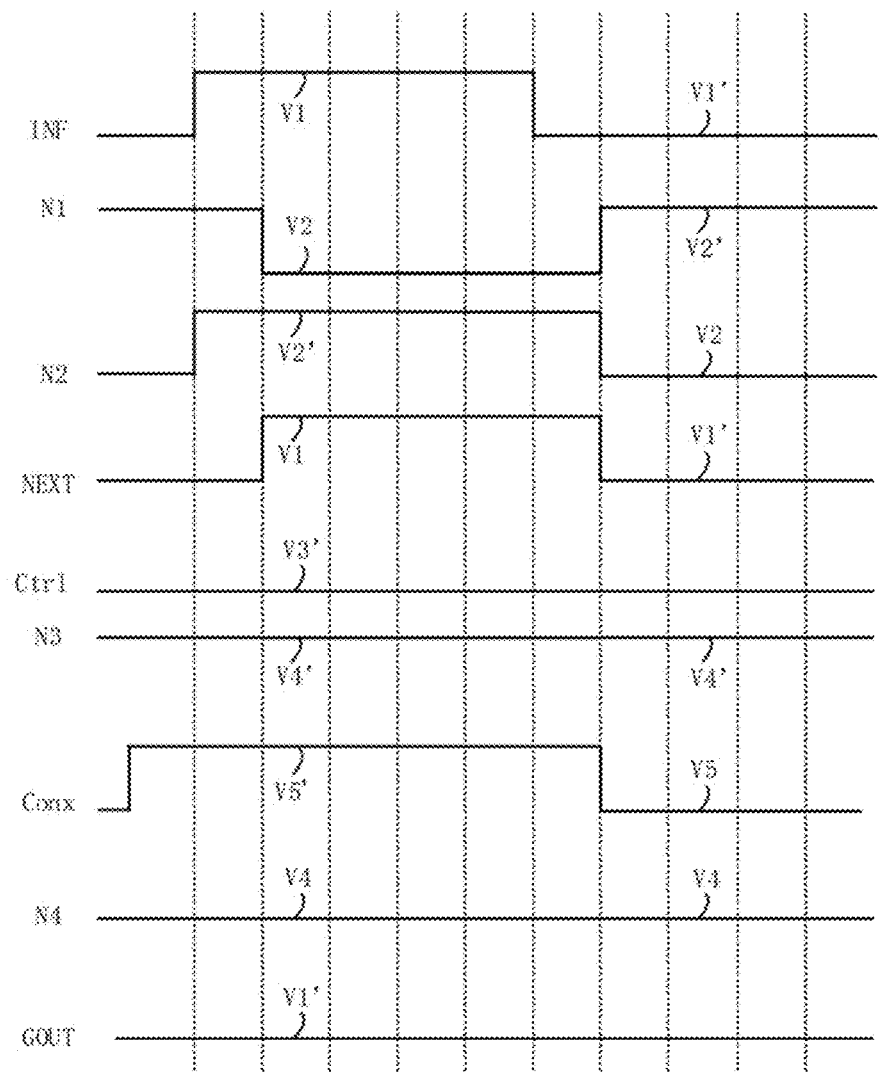
FIG. 4 is a timing diagram of another shift register unit in accordance with an embodiment of the present disclosure.

Exemplarily, FIG. 3 is a timing diagram of a shift register unit in accordance with an embodiment of the present disclosure, and FIG. 4 is a timing diagram of another shift register unit in accordance with an embodiment of the present disclosure, where the timing of the shift register unit in FIG. 3 can control the pixels electrically connected to the shift register unit to refresh, and the timing of the shift register unit in FIG. 4 can control the pixels electrically connected to the shift register unit to stop refreshing. Refer to FIG. 2 to FIG. 4, in the same shift register unit 20, after the input signal INF jumps to a first level V1, the driving control module 210 can control the signal of the first output node N1 to be at a valid level V2 and the signal of the second output node N2 to be at an invalid level V2' according to the first level V1 of the input signal INF, so that the stage transfer module 220 controls the stage transfer signal NEXT to be at the first level V1. After the input signal INF jumps to the second level V1', the driving control module 210 can control the signal of the first output node N1 to be at the invalid level V2' and the signal of the second output node N2 to be at the valid level V2 according to the second level V1' of the input signal INF, so that the stage transfer module 220 controls the stage transfer signal NEXT to be at the second level V1'. The stage transfer signal NEXT can be used as the input signal INF of the next level shift register unit 20 to implement the sequential shifting of the valid pulse of the input signal INF, that is, to implement the sequential driving of the shift register units 20 of each level. The first level V1 may be a valid level of the input signal INF, the stage transfer signal NEXT and the scanning signal GOUT, and the second level V1' may be an invalid level of the input signal INF, the stage transfer signal NEXT and the scanning signal GOUT.

It should be noted that the driving of the shift register units 20 of each level is not affected by the transmission control signal Ctrl, the auxiliary control signal Conx, and the scanning signal GOUT. That is, no matter what level the transmission control signal Ctrl, the auxiliary control signal Conx, and the scanning signal GOUT are at, the shift register units 20 of each level can be driven in sequence.

Refer to FIG. 2 and FIG. 3, the transmission control signal Ctrl is at an enabling level V3. When the stage transfer signal NEXT is at the first level V1, the transmission control module 230 can control the signal of the third output node N3 to be at a valid level V4 according to the first level V1 of the stage transfer signal NEXT and the enabling level V3 of the transmission control signal Ctrl. At this moment, no matter what level the signal of the second output node N2 and the auxiliary control signal Conx are at, the auxiliary control module 240 can control the signal of the fourth output node N4 to be at an invalid level V4' according to the valid level V4 of the third output node N3. The scanning module 250 can control the scanning signal GOUT to be at the first level V1 according to the valid level V4 of the third output node N3 and the invalid level V4' of the fourth output node N4, that is, the scanning module 250 can output the valid level of the scanning signal GOUT.

Refer to FIG. 2 and FIG. 3, the transmission control signal Ctrl is at the enabling level V3. When the stage transfer signal NEXT is at the second level V1', the transmission control module 230 can control the signal of the third output node N3 to be at the invalid level V4' according to the first level V1 of the stage transfer signal NEXT and the enabling level V3 of the transmission control signal Ctrl. At this phase, the signal of the second output node N2 is at the valid level V2, and the auxiliary control signal Conx can also be at a valid level V5 (the valid durations of the two overlap), so that the auxiliary control module 240 can control the signal of the fourth output node N4 to be at the valid level V4, and the scanning module 250 can control the scanning signal GOUT to be at the second level V1' according to the invalid level V4' of the third output node N3 and the valid level V4 of the fourth output node N4. That is, the scanning module 250 can output the invalid level of the scanning signal GOUT.

It should be noted that when the transmission control signal Ctrl is at the enabling level V3, if the stage transfer signal NEXT is at the first level V1, the signal of the third output node N3 can be at the valid level V4, so that the scanning module 250 can control the scanning signal GOUT to be at the first level V1. If the stage transfer signal NEXT is at the second level V1', the signal of the third output node N3 can be at the invalid level V4', so that the scanning module 250 can control the scanning signal GOUT to be at the second level V1'. That is, when the transmission control signal Ctrl is at the enabling level V3, the scanning signal GOUT can synchronize with the stage transfer signal NEXT, so that when the driven shift register unit 20 outputs the valid level of the stage transfer signal NEXT, the driven shift register unit 20 can also output the valid level of the scanning signal GOUT, so that the pixels electrically connected to the shift register unit can be refreshed.

Refer to FIG. 2 and FIG. 4, the transmission control signal Ctrl is at a non-enabling level V3'. When the stage transfer signal NEXT is at the first level V1, the transmission control module 230 can control the signal of the third output node N3 to be at the invalid level V4' according to the first level V1 of the stage transfer signal NEXT and the non-enabling level V3' of the transmission control signal Ctrl, so that the scanning module 250 stops controlling the scanning signal GOUT to be at the first level V1, and the scanning signal GOUT can continue to be maintained at the second level V1'. Because the signal of the third output node N3 is at the invalid level V4', the auxiliary control module 240 is no longer affected by the signal of the third output node N3, and the auxiliary control module 240 does not have to control the signal of the fourth output node N4 to be at the invalid level V4'. The auxiliary control module 240 can transmit the signal of the second output node N2 or a low-level auxiliary control signal Conx to the fourth output node N4 when the second output node N2 is at the valid level V2 and the auxiliary control signal Conx is at the valid level V5, so that the fourth output node N4 is at the valid level V4 (V2=V5=V4). Under the actions of the signal of the second output node N2 and the auxiliary control signal Conx, the auxiliary control module 240 can control the signal of the fourth output node N4 to be at the valid level V4 during at least part of the period when the stage transfer signal NEXT is at the first level V1, so that the scanning module 250 can control the scanning signal GOUT to be at the second level V1' according to the invalid level V4' of the third output node N3 and the valid level V4 of the fourth output node N4. That is, the scanning module 250 can output the invalid level of the scanning signal GOUT.

Refer to FIG. 2 and FIG. 4, the transmission control signal Ctrl is at the non-enabling level V3'. When the stage transfer signal NEXT is at the second level V1', the transmission control module 230 can control the signal of the third output node N3 to be at the invalid level V4' according to the first level V1 of the stage transfer signal NEXT. At this phase, the signal of the second output node N2 is at the valid level V2, and the auxiliary control signal Conx can also be at the valid level V5 (the valid durations of the two overlap), so that the auxiliary control module 240 can control the signal of the fourth output node N4 to be at the valid level V4, the scanning module 250 can control the scanning signal GOUT to be at the second level V1' according to the invalid level V4' of the third output node N3 and the valid level V4 of the fourth output node N4. That is, the scanning module 250 can output the invalid level of the scanning signal GOUT.

It should be noted that when the transmission control signal Ctrl is at the non-enabling level V3', no matter if the stage transfer signal NEXT is at the first level V1 or the second level V1', the signal of the third output node N3 will be at the invalid level V4', so that the scanning module 250 stops outputting the first level V1 of the scanning signal GOUT and the scanning signal GOUT is always maintained at the second level V1'. That is, when the transmission control signal Ctrl is at the non-enabling level V3', the valid pulse of the scanning signal GOUT is not synchronized with the valid pulse of the stage transfer signal NEXT, so that when the driven shift register unit 20 outputs the valid level of the stage transfer signal NEXT, the valid level of the scanning signal GOUT cannot be output, so that the pixels electrically connected to the shift register unit stop refreshing.

It should also be noted that when the transmission control signal is at the non-enabling level V3' and the stage transfer signal NEXT is at the first level V1, the auxiliary control module 240 can control the signal of the fourth output node N4 to be at the valid level V4 for at least part of the time duration. That is, under the actions of the signal of the second output node N2 and the auxiliary control signal Conx, the auxiliary control module 240 can control the signal of the fourth output node N4 to be at the valid level V4 for at least part of the time duration when the signal of the second output node N2 is at the invalid level V2', so that the scanning module 250 can control the scanning signal GOUT to be at the second level V1' according to the valid level V4 of the fourth output node N4. During this time duration, the scanning signal GOUT is an active signal and the second level V1' of the scanning signal GOUT is not easily interfered by other signals, which facilitates improving the stability of the scanning signal GOUT, especially the stability of the scanning signal GOUT when it is at the second level V1'.

Figure 5:
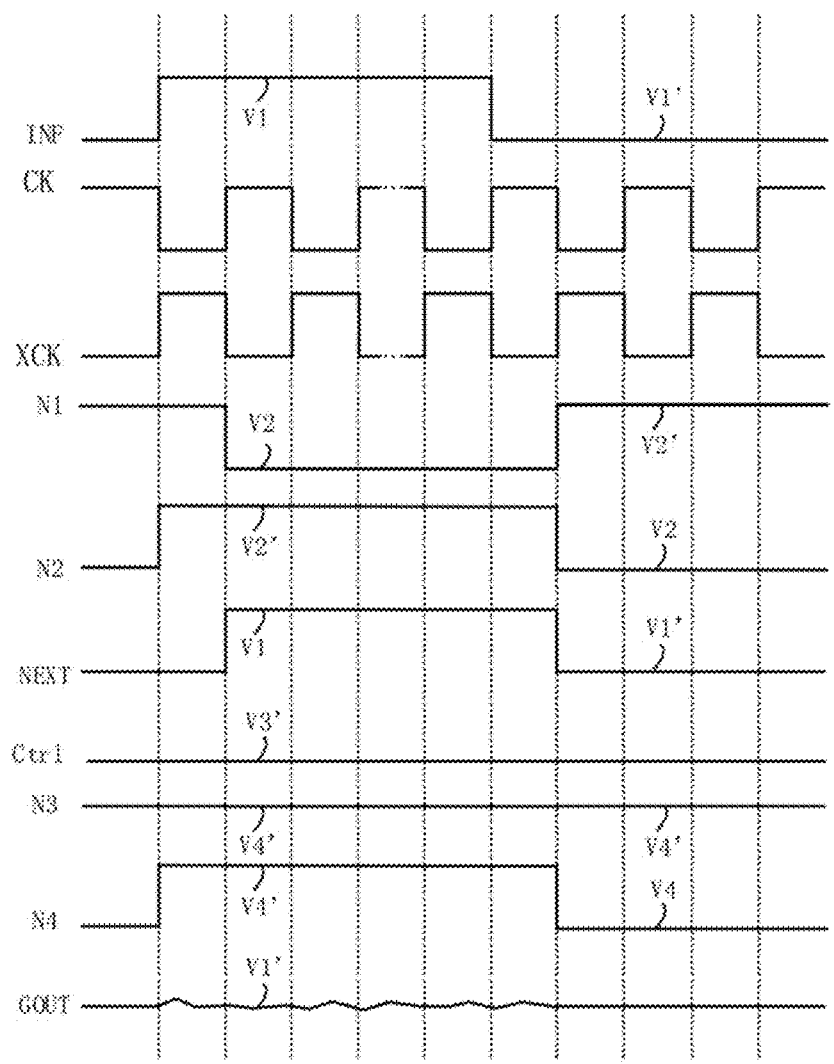
FIG. 5 is a timing diagram of another shift register unit in accordance with an embodiment of the present disclosure.

If the auxiliary control module 240 is not configured in the shift register unit 20, and the fourth output node N4 is electrically connected to the second output node N2 (not shown in FIG. 2), the scanning module 250 will directly receive the signal of the second output node N2 so that the transmission control signal Ctrl is at the non-enabling level V3'. When the stage transfer signal NEXT is at the first level V1, the third output node N3 and the fourth output node N4 are always at the invalid level V4' at this phase, as shown in FIG. 5, so that the scanning module 250 cannot control the scanning signal GOUT to be at the second level V1', and the scanning signal GOUT can only be maintained at the second level V1' according to the previous potential. At this phase, the scanning signal GOUT can only be a passive signal. Although the scanning signal GOUT can continue to be maintained at the second level V1', the second level V1' of the scanning signal GOUT is easily affected by other signals. For example, there will be parasitic capacitance between the scanning line and other signal lines or other components and devices. The coupling effect of the parasitic capacitance will cause the potential of the scanning signal GOUT on the scanning line to fluctuate, affecting the display effect of the display panel.

It should be noted that the valid levels of different signals may be the same or may be different. For example, the valid levels of the input signal INF, the stage transfer signal NEXT and the scanning signal GOUT are all the first level V1, and the invalid levels are all the second level V1'. The valid levels of the first output node N1 and the second output node N2 are all V2, and the invalid levels are all V2'. The stage transfer signal NEXT is the shifted input signal INF, and the scanning signal GOUT can be synchronized with the stage transfer signal NEXT at least part of the time, therefore, the valid level and invalid level of the input signal INF, the stage transfer signal NEXT and the scanning signal GOUT should be the same. The signals of the first output node N1 and the second output node N2 are all used to control the stage transfer module 220 and the valid level and invalid level of the two signals should be the same. The first level V1 of the input signal INF, the stage transfer signal NEXT and the scanning signal GOUT are used to control the switching device in pixels to turn on, and the valid level V2 of the signals of the first output node N1 and the second output node N2 is used to control the switching device in the stage transfer module 220 to turn on. The first level V1 and the valid level V2 control different objects, therefore V1 and V2 may be different, for example, V1 may be a high level, and V2 may be a low level. Similarly, V1, V2, V3, V4, and V5 control different objects, and any two of V1, V2, V3, V4, and V5 may be different. FIG. 3 only exemplarily shows that V1 is high level, V2 is low level, V3 is high level, V4 is low level, and V5 is low level, but the present disclosure is not limited to this.

In some embodiments, V1, V2, V3, V4, and V5 may all be high levels, or all be low levels.

Embodiments of the present disclosure implement the sequential driving of the shift register unit by configuring a driving control module and a scanning module in the shift register unit. By configuring a transmission control module, the signal of the third output node can be controlled. Under the control of the transmission control signal, the scanning signal may be asynchronous with the level transfer signal. In some display frames, the scanning signal received by the pixels in some areas may always be at an invalid level, and some pixels are controlled to stop refreshing, so as to implement the partitioning and frequency-dividing of the display panel and to reduce the power consumption of the display panel. By configuring an auxiliary control module, the signal of the fourth output node can be controlled. Under the control of the signal of the second output node, the signal of the third output node, and the auxiliary control signal, the auxiliary control module can control the signal of the fourth output node to be at a valid level at least part of the time, when the level transfer signal is at a valid level but the signal of the third output node is at an invalid level, so that the scanning module can control the scanning signal to be at a second level. Thereby, it improves the stability of the scanning signal, avoids floating of the scanning signal, and avoids large fluctuations due to the effect of parasitic capacitance, affecting the display effect.

Optionally, the display panel may include a multi-frequency driving mode. At least part of the display frames of the multi-frequency driving mode are first display frames, where a first display frame includes a refresh phase and a holding phase. The driving circuit includes at least one first shift register unit. In the holding phase, the transmission control signal is at a non-enabling level, the level transfer signal output by the first shift register unit includes a first level, and the scanning signal is at a second level. The first level can be a valid level of the level transfer signal and the scanning signal, and the second level can be an invalid level of the level transfer signal and the scanning signal.

In the multi-frequency driving mode, different areas of the display panel have different refresh frequencies, and the display area may include a low-frequency display area and a high-frequency display area, where the refresh frequency of the pixels located in the low-frequency display area is less than the refresh frequency of the pixels located in the high-frequency display area. At least part of the display frames of the multi-frequency driving mode are first display frames. In a first display frame, the pixels located in the low-frequency display area are not refreshed, the grayscale of the previous display frame is maintained, and the pixels located in the high-frequency display area can be refreshed to the grayscale of the current display frame. The first display frame includes a refresh phase and a holding phase. The refresh phase refers to the phase in which the driving circuit can output the valid pulse of the scanning signal and control at least part of the pixels to refresh. The holding phase refers to the phase in which the driving circuit cannot output the valid pulse of the scanning signal and can control at least part of the pixels to stop refreshing and maintain the grayscale of the previous display frame. In the refresh phase and the holding phase, shift register units are driven, that is, the shift register units output the valid pulse of the level transfer signal. The first shift register unit refers to the shift register unit electrically connected to the pixels located in the low-frequency display area.

Figure 6:
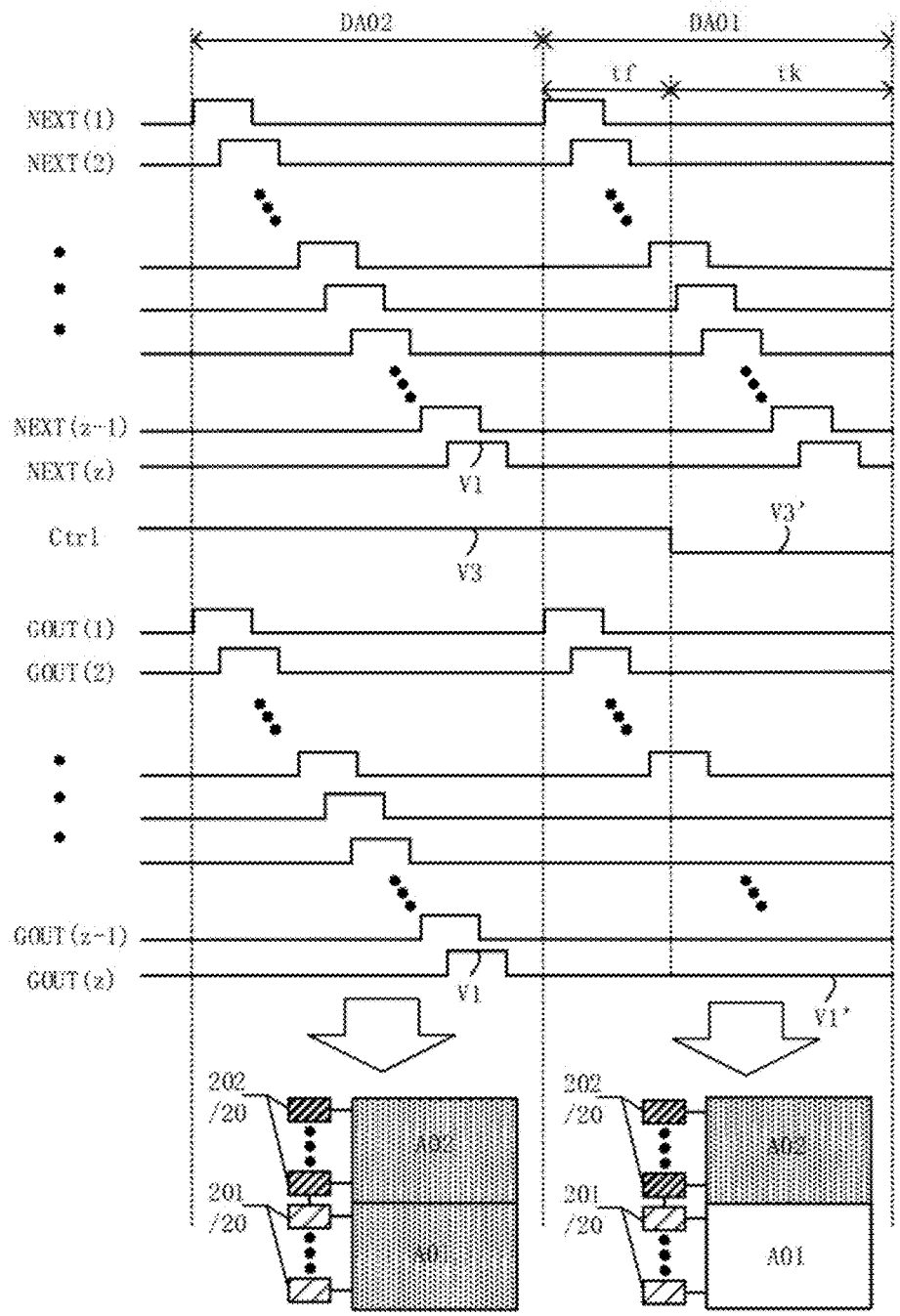
FIG. 6 is a timing diagram of a display panel in a multi-frequency driving mode in accordance with an embodiment of the present disclosure.
Figure 7:
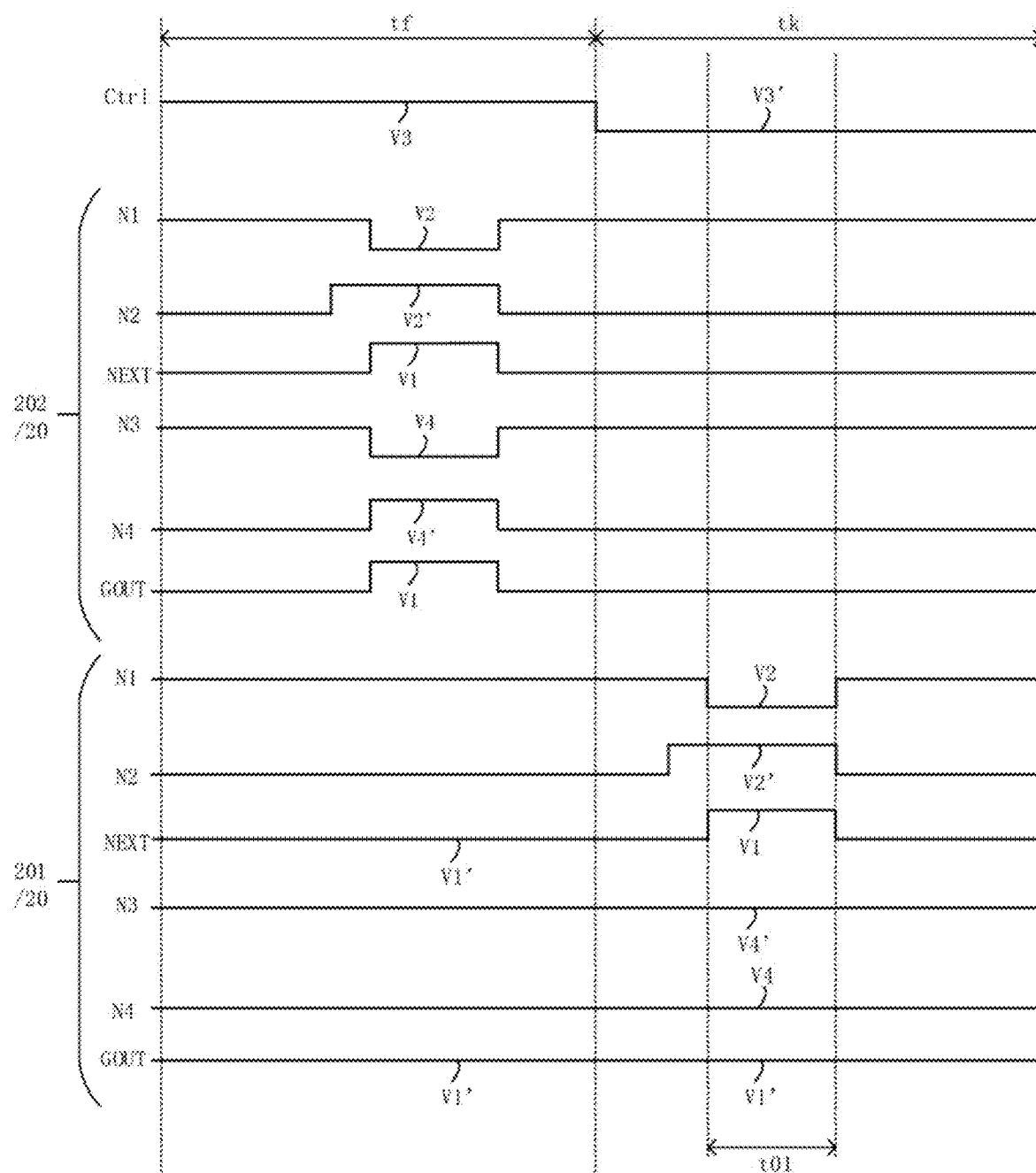
FIG. 7 is a timing diagram of a driving circuit in accordance with an embodiment of the present disclosure.

Exemplarily, the transmission control signals Ctrl received by the shift register units 20 of each level may be multiplexed with each other, that is, the shift register units 20 of each level may receive the same transmission control signal Ctrl. For example, where both the valid level of the level transfer signal and the valid level of the scanning signal are high levels, and the driving circuit includes z cascaded shift register units, FIG. 6 is a timing diagram of a display panel in a multi-frequency driving mode in accordance with an embodiment of the present disclosure, and FIG. 7 is a timing diagram of a driving circuit in accordance with an embodiment of the present disclosure. Refer to FIG. 6 and FIG. 7, in a refresh phase tf of a first display frame DA01, part of the shift register units 20 outputs a valid pulse of the stage transfer signal NEXT, and the transmission control signal Ctrl is at an enabling level V3, so that the scanning signal GOUT of part of the shift register units 20 is synchronized with the stage transfer signal NEXT, outputs a valid pulse, and controls part of the pixels to be refreshed. In this phase, a first shift register unit 201 has not been driven yet, so the stage transfer signal NEXT and the scanning signal GOUT of the first shift register unit 201 are both at invalid levels, that is, both are at the second level V1', and the pixels electrically connected to the first shift register unit 201 are not refreshed.

Refer further to FIG. 6 and FIG. 7, in the holding phase tk of the first display frame DA01, the transmission control signal Ctrl is at the non-enabling level V3', the first shift register unit 201 is driven, and the scanning signal GOUT of the first shift register unit 201 is not synchronized with the stage transfer signal NEXT. The stage transfer signal NEXT of the first shift register unit 201 includes a valid pulse, that is, it includes the first level V1 so that the input signal INF in the driving circuit can be shifted in sequence, and the shift register units 20 of each level can be driven in sequence. However, in the holding phase tk, the scanning signal GOUT is always at an invalid level, that is, it is always at the second level V1' and the pixels electrically connected to the first shift register unit 201 are still not refreshed, so that the pixels located in a low-frequency display area A01 can be refreshed at a lower frequency, thereby implementing zoned and frequency-controlled refresh of the display panel.

In an embodiment, refer further to FIG. 6 and FIG. 7, in the holding phase tk, when the stage transfer signal NEXT output by the same first shift register unit 201 is at the first level V1 and the scanning signal GOUT is at the second level V1', the signal of the first output node N1 is at the valid level V2, the signal of the second output node N2 is at the invalid level V2', and the signal of the third output node N3 is at the invalid level V4'. In the holding phase tk, when the stage transfer signal NEXT output by the same first shift register unit 201 is at the first level V1 and the scanning signal GOUT is at the second level V1', at least part of the time, the signal of the fourth output node N4 is at the valid level V4.

Specifically, when the signal of the first output node N1 is at the valid level V2, the stage transfer module 220 can output the first level V1 of the stage transfer signal NEXT. At the same time, the signal of the second output node N2 is at the invalid level V2', so that the stage transfer module 220 stops outputting the second level V1' of the stage transfer signal NEXT. In the holding phase tk, the transmission control signal Ctrl is at the non-enabling level V3', so that the signal of the third output node N3 can be asynchronous with the signal of the first output node N1, and the signal of the third output node N3 can always be at the invalid level V4', so that the scanning module 250 stops outputting the first level V1 of the scanning signal GOUT.

In a t01 phase of the holding phase tk, the stage transfer signal NEXT output by the first shift register unit 201 is at the first level V1, the scanning module 250 stops outputting the first level V1 of the scanning signal GOUT, and the scanning signal GOUT is at the second level V1'. In at least part of the duration of the t01 phase, the signal of the fourth output node N4 is at the valid level V4, so that in at least part of the period of the t01 phase, the scanning module 250 can output the second level V1' of the scanning signal GOUT, reduce the floating time of the scanning signal GOUT on the scanning line, and facilitate the stability of the scanning signal GOUT in the t01 phase.

Optionally, the driving circuit may further include at least one second shift register unit. In the refresh phase, the transmission control signal is at an enabling level, and the level transfer signal and the scanning signal output by the second shift register unit both include the first level.

The second shift register unit is a shift register unit electrically connected to the pixels located in the high-frequency display area.

Exemplarily, refer further to FIG. 6 and FIG. 7, where the valid level of the level transfer signal and the valid level of the scanning signal are both high levels, and the driving circuit includes z cascaded shift register units. In the refresh phase tf of the first display frame DA01, the transmission control signal Ctrl is at the enabling level V3, a second shift register unit 202 is driven, and the scanning signal GOUT of the second shift register unit 202 synchronizes with the stage transfer signal NEXT. When the stage transfer signal NEXT of the second shift register unit 202 includes a valid pulse, that is, it includes the first level V1, the scanning signal GOUT of the second shift register unit 202 also includes the first level V1, and the pixels electrically connected to the second shift register unit 202 can be refreshed so that the pixels located in a high-frequency display area A02 can be refreshed at a higher frequency, thereby implementing zoned and frequency-controlled refresh of the display panel.

Refer further to FIG. 6 and FIG. 7, in the holding phase tk of the first display frame DA01, the transmission control signal Ctrl is at the non-enabling level V3', the second shift register unit 202 is driven, and the stage transfer signal NEXT and the scanning signal GOUT output by the second shift register unit 202 will no longer jump to a valid level, so the stage transfer signal NEXT and the scanning signal GOUT of the second shift register unit 202 can both be at invalid levels, that is, both are at the second level V1'. The transmission control signal Ctrl will not affect the stage transfer signal NEXT and the scanning signal GOUT of the second shift register unit 202, that is, the transmission control signal Ctrl will not affect the normal refresh of the pixels located in the high-frequency display area A02.

In an embodiment, refer further to FIG. 6 and FIG. 7, in the refresh phase tf, when the stage transfer signal NEXT and the scanning signal GOUT output by the same second shift register unit 202 are both at the first level V1, the signal of the first output node N1 is at the valid level V2, the signal of the third output node N3 is at the valid level V4, the signal of the second output node N2 is at the invalid level V2', and the signal of the fourth output node N4 is at the invalid level V4'.

Specifically, when the signal of the first output node N1 is at the valid level V2, the stage transfer module 220 can output the first level V1 of the stage transfer signal NEXT. At the same time, the signal of the second output node N2 is at the invalid level V2', so that the stage transfer module 220 stops outputting the second level V1' of the stage transfer signal NEXT. When the signal of the third output node N3 is at the valid level V4, the scanning module 250 can output the first level V1 of the scanning signal GOUT. At the same time, the signal of the fourth output node N4 is at the invalid level V4', so that the scanning module 250 stops outputting the second level V1' of the scanning signal GOUT. In this way, it avoids the stage transfer module 220 and the scanning module 250 simultaneously outputting signals of two levels, which causes signal hedging and damages the circuit.

Based on the embodiments above, refer to FIG. 6 and FIG. 7, part of the display frame of the multi-frequency driving mode is a second display frame DA02. In the second display frame DA02, the stage transfer signal NEXT and the scanning signal GOUT of the first shift register unit 201 both include the first level V1, and the stage transfer signal NEXT and the scanning signal GOUT of the second shift register unit 202 also include the first level V1. The multi-frequency driving mode includes a plurality of display cycles, where a display cycle includes at least one first display frame DA01 and at least one second display frame DA02, and the second display frame DA02 is located before the first display frame DA01.

Specifically, in the same display cycle, in the second display frame DA02, the first shift register unit 201 and the second shift register unit 202 can both output valid pulses of the stage transfer signal NEXT and valid pulses of the scanning signal GOUT, so that the pixels located in the high-frequency display area A02, and the pixels located in the low-frequency display area A01 can both rewrite the data signals. In the first display frame DA01, the first shift register unit 201 and the second shift register unit 202 can both output valid pulses of the stage transfer signal NEXT, and only the second shift register unit 202 can output valid pulses of the scanning signal GOUT, the pixels located in the high-frequency display area A02 can rewrite the data signals, and the pixels located in the low-frequency display area A01 do not rewrite the data signals, so that the pixels located in the low-frequency display area A01 continue to maintain the grayscale of the second display frame DA02.

Exemplarily, taking a display cycle that includes a second display frame DA02 and a first display frame DA01, refer further to FIG. 6 and FIG. 7, the pixels located in the high-frequency display area A02 can rewrite the data signal in each display frame, and the pixels located in the low-frequency display area A01 can rewrite the data signal only in the second display frame DA02. The refresh frequency of the pixels located in the high-frequency display area A02 is twice the refresh frequency of the pixels located in the low-frequency display area A01, and the refresh frequency of the pixels located in the low-frequency display area A01 is reduced to ½ of the refresh frequency of the pixels located in the high-frequency display area A02.

It should be noted that when the display cycle includes one second display frame DA02 and d first display frames DA01, the refresh frequency of the pixels located in the low-frequency display area A01 is reduced to 1/(d+1) of the refresh frequency of the pixels located in the high-frequency display area A02, where d is a positive integer.

Figure 8:
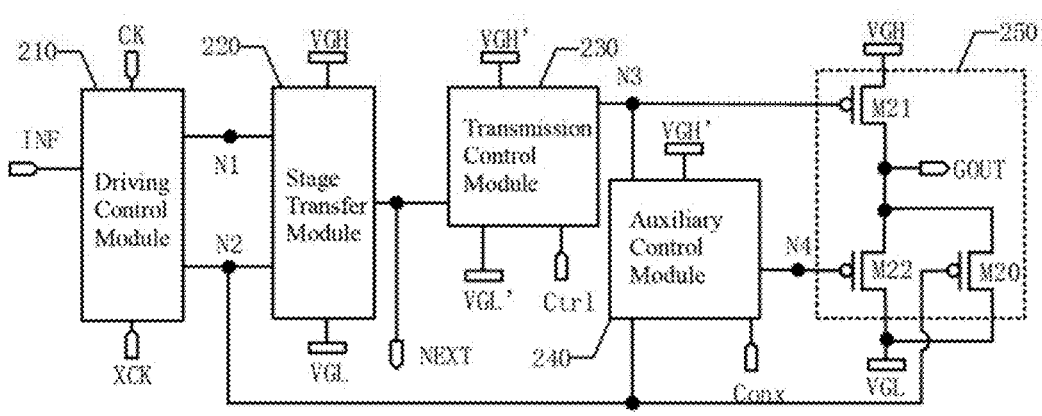
FIG. 8 is a schematic diagram of another shift register unit in accordance with an embodiment of the present disclosure.

Optionally, FIG. 8 is a schematic diagram of another shift register unit in accordance with an embodiment of the present disclosure. Refer to FIG. 8, the scanning module 250 includes a first scanning transistor M21 and a second scanning transistor M22. A gate of the first scanning transistor M21 is electrically connected to the third output node N3, a first electrode of the first scanning transistor M21 receives a first level signal VGH, and a second electrode of the first scanning transistor M21 is configured to output the scanning signal GOUT. A gate of the second scanning transistor M22 is electrically connected to the fourth output node N4, a first electrode of the second scanning transistor M22 receives a second level signal VGL, and a second electrode of the second scanning transistor M22 is configured to output the scanning signal GOUT.

The potential of the first level signal VGH is the first level V1, which is also the valid level of the stage transfer signal NEXT and the scanning signal GOUT. The potential of the second level signal VGL is the second level V1', which is also the invalid level of the stage transfer signal NEXT and the scanning signal GOUT.

Specifically, when the third output node N3 is at the valid level V4, the first scanning transistor M21 is turned on, and the scanning module 250 can output the first level signal VGH as the scanning signal GOUT. When the third output node N3 is at the invalid level V4', the first scanning transistor M21 is turned off, and the scanning module 250 stops outputting the first level signal VGH as the scanning signal GOUT. When the fourth output node N4 is at the valid level V4, the second scanning transistor M22 is turned on, and the scanning module 250 can output the second level signal VGL as the scanning signal GOUT. When the fourth output node N4 is at the invalid level V4', the second scanning transistor M22 is turned off, and the scanning module 250 stops outputting the second level signal VGL as the scanning signal GOUT. In this way, the scanning module 250 can control the scanning signal GOUT according to the signal of the third output node N3 and the signal of the fourth output node N4.

It should be noted that the first scanning transistor M21 and the second scanning transistor M22 may be P-type transistors or N-type transistors. The type of transistor may be set according to actual needs, which is not limited by the embodiments of the present disclosure.

Figure 9:
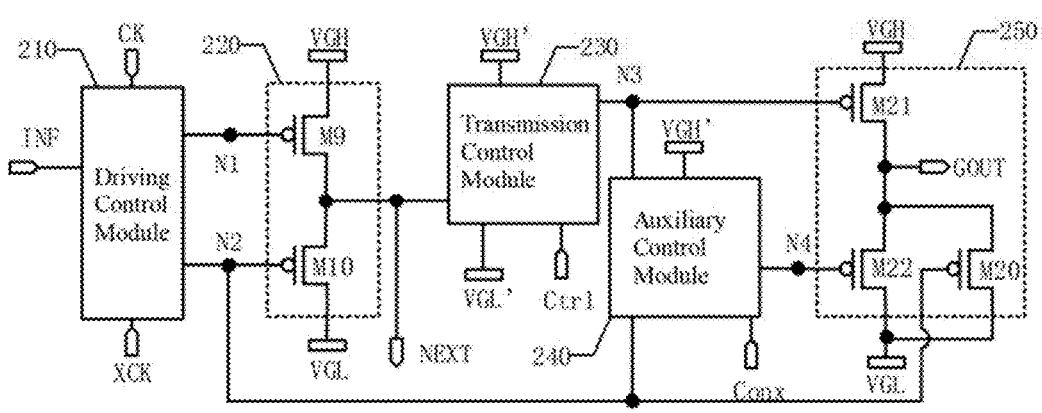
FIG. 9 is a schematic diagram of another shift register unit in accordance with an embodiment of the present disclosure.

In an embodiment, refer further to FIG. 9, the scanning module also includes an auxiliary output transistor M20. A gate of the auxiliary output transistor M20 is electrically connected to the second output node N2, a first electrode of the auxiliary output transistor M20 receives the second level signal VGL, and a second electrode of the auxiliary output transistor M20 is configured to output the scanning signal GOUT.

Specifically, when the second output node N2 is at the valid level V4, the auxiliary output transistor M20 is turned on, and the scanning module 250 can also output the second level signal VGL as the scanning signal GOUT. When the second output node N2 is at the invalid level V4', the auxiliary output transistor M20 is turned off, but the second scanning transistor M22 can be turned on under the control of the fourth output node N4, and the scanning module 250 can still output the second level signal VGL as the scanning signal GOUT. In this way, the second level signal VGL can be output through the second scanning transistor M22 and/or the auxiliary output transistor M20 to charge the scanning signal GOUT, so that the scanning module 250 can output the second level signal VGL as the scanning signal GOUT when the second output node N2 is at the valid level V4 and/or the fourth output node N4 is at the valid level V4, so as to implement multi-channel output of the second level signal VGL and charge the scanning signal GOUT. In one aspect, this facilitates improving the charging speed of the scanning signal GOUT. In another aspect, this facilitates the stability of the scanning signal GOUT.

Optionally, FIG. 9 is a schematic diagram of another shift register unit in accordance with an embodiment of the present disclosure. Refer to FIG. 9, the stage transfer module 220 includes a first level transfer transistor M9 and a second level transfer transistor M10. A gate of the first level transfer transistor M9 is electrically connected to the first output node N1, a first electrode of the first level transfer transistor M9 receives the first level signal VGH, and a second electrode of the first level transfer transistor M9 is configured to output the stage transfer signal NEXT. A gate of the second level transfer transistor M10 is electrically connected to the second output node N2, a first electrode of the second level transfer transistor M10 receives the second level signal VGL, and a second electrode of the second level transfer transistor M10 is configured to output the stage transfer signal NEXT.

Specifically, when the first output node N1 is at the valid level V2, the first level transfer transistor M9 is turned on, and the stage transfer module 220 can output the first level signal VGH as the stage transfer signal NEXT. When the first output node N1 is at the invalid level V2', the first level transfer transistor M9 is turned off, and the stage transfer module 220 stops outputting the first level signal VGH as the stage transfer signal NEXT. When the second output node N2 is at the valid level V2, the second level transfer transistor M10 is turned on, and the stage transfer module 220 can output the second level signal VGL as the stage transfer signal NEXT. When the second output node N2 is at the invalid level V2', the second level transfer transistor M10 is turned off, and the stage transfer module 220 stops outputting the second level signal VGL as the stage transfer signal NEXT. In this way, the stage transfer module 220 can control the stage transfer signal NEXT according to the signal of the first output node N1 and the signal of the second output node N2.

Figure 10:
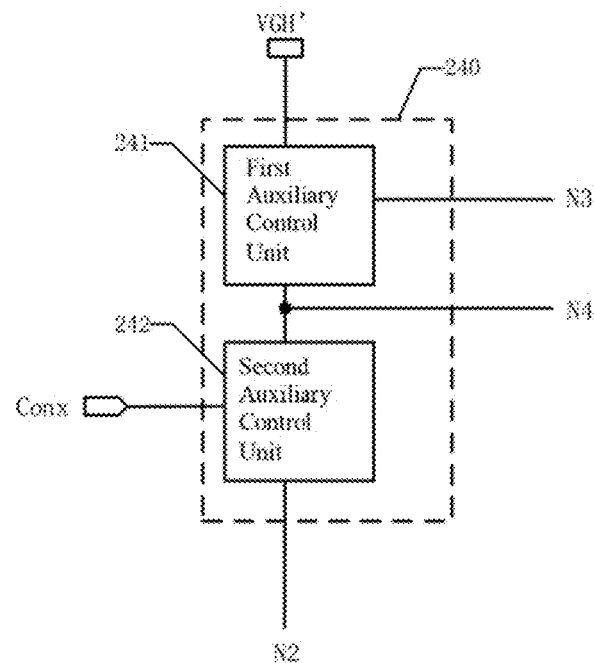
FIG. 10 is a schematic diagram of an auxiliary control module in accordance with an embodiment of the present disclosure.

Optionally, FIG. 10 is a schematic diagram of an auxiliary control module in accordance with an embodiment of the present disclosure. Refer to FIG. 10, the auxiliary control module 240 includes a first auxiliary control unit 241 and a second auxiliary control unit 242. The first auxiliary control unit 241 is configured to receive the signal of the third output node N3 and a first fixed signal VGH', and control the signal of the fourth output node N4. The second auxiliary control unit 242 is configured to receive the auxiliary control signal Conx and the signal of the second output node N2, and control the signal of the fourth output node N4.

Exemplarily, the level of the first fixed signal VGH' is the invalid level V4' of the fourth output node N4. The first fixed signal VGH' and the first level signal VGH may be the same or different, which is not limited by embodiments of the present disclosure.

Exemplarily, taking the potential of the first fixed signal VGH' to be a high level, when the signal of the third output node N3 is at the valid level V4, the first auxiliary control unit 241 can pull up the signal of the fourth output node N4 to the invalid level V4', so as to ensure that the scanning module 250 does not simultaneously output the first level signal VGH and the second level signal VGL as the scanning signal GOUT. When the signal of the third output node N3 is at the invalid level V4', the first auxiliary control unit 241 no longer controls the signal of the fourth output node N4, and the signal of the fourth output node N4 is affected by the auxiliary control signal Conx and the signal of the second output node N2. When the auxiliary control signal Conx is at the valid level V5 and the auxiliary control signal Conx is at the valid level V2, the second auxiliary control unit 242 can control the signal of the fourth output node N4 to be at the valid level V4.

Moreover, when the transmission control signal Ctrl received by the transmission control module 230 is at the non-enabling level V3', the signal of the third output node N3 can always be at the invalid level V4', that is, the signal of the fourth output node N4 can always be controlled by the second auxiliary control unit 242. Therefore, in this phase, the second auxiliary control unit 242 can control the signal of the fourth output node N4 to always be at the valid level V4, or at least part of the time in this phase, especially at least part of the time when the stage transfer signal NEXT is at the first level V1 and the scanning signal GOUT is at the second level V1', the second auxiliary control unit 242 can control the signal of the fourth output node N4 to be at the valid level V4. This can increase the time that the scanning signal GOUT is an active signal and reduce the floating time of the scanning signal GOUT, which facilitates improving the stability of the scanning signal GOUT, thereby improving the display effect of the display panel.

Figure 11:
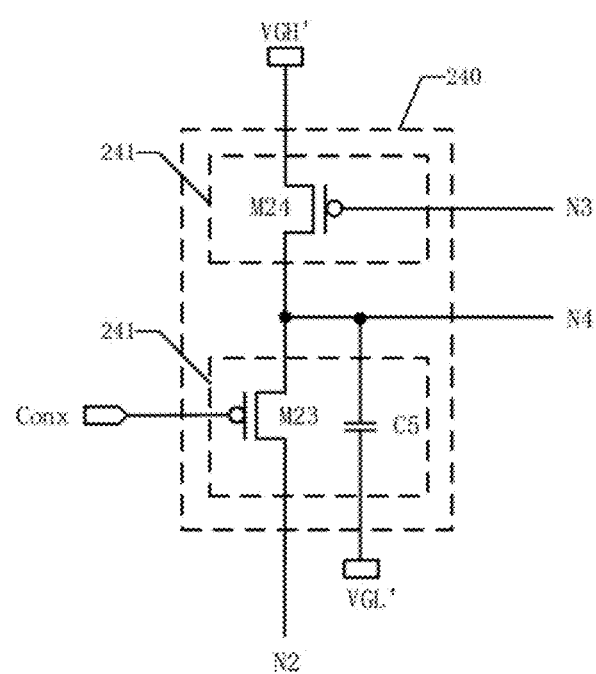
FIG. 11 is a schematic diagram of another auxiliary control module in accordance with an embodiment of the present disclosure.

In an embodiment, FIG. 11 is a schematic diagram of another auxiliary control module in accordance with an embodiment of the present disclosure. Refer to FIG. 11, the first auxiliary control unit 241 includes a first auxiliary transistor M24. A gate of the first auxiliary transistor M24 is electrically connected to the third output node N3, a first electrode of the first auxiliary transistor M24 receives the first fixed signal VGH', and a second electrode of the first auxiliary transistor M24 is electrically connected to the fourth output node N4.

Specifically, the first auxiliary transistor M24 can be turned on or off under the control of the first fixed signal VGH' and the signal of the third output node N3, and when the first auxiliary transistor M24 is turned on, the first fixed signal VGH' can be transmitted to the fourth output node N4.

Exemplarily, taking the valid level V4 of the third output node N3 to be a low level and the first auxiliary transistor M24 as a P-type transistor, when the third output node N3 is at the valid level V4, the first auxiliary transistor M24 is turned on, and the fourth output node N4 is the first fixed signal VGH', that is, the invalid level V4'. It should be noted that in other embodiments, the valid level V4 of the third output node N3 can also be a high level, and the first auxiliary transistor M24 can also be an N-type transistor.

In another embodiment, refer further to FIG. 11, the second auxiliary control unit 242 includes a second auxiliary transistor M23. A gate of the second auxiliary transistor M23 receives the auxiliary control signal Conx, a first electrode of the second auxiliary transistor M23 is electrically connected to the second output node N2, and a second electrode of the second auxiliary transistor M23 is electrically connected to the fourth output node N4.

Specifically, the second auxiliary transistor M23 can be turned on or off under the control of the signal of the second output node N2 and the auxiliary control signal Conx, and when the second auxiliary transistor M23 is turned on, the signal of the second output node N2 can be transmitted to the fourth output node N4.

Exemplarily, taking the valid level V5 of the auxiliary control signal Conx to be a low level and the second auxiliary transistor M23 to be a P-type transistor, when the auxiliary control signal Conx is at the valid level V5, the second auxiliary transistor M23 is turned on, and the signal of the fourth output node N4 is the signal of the second output node N2. If the signal of the second output node N2 is at the valid level V2, the signal of the fourth output node N4 is at the valid level V4, and V4=V2. When the auxiliary control signal Conx is at the invalid level V5', the second auxiliary transistor M23 is turned off, and the signal of the fourth output node N4 can continue to be maintained at the valid level V4 until the auxiliary control signal Conx is at the valid level V5 and the signal of the second output node N2 is at the invalid level V2'. The second auxiliary transistor M23 is turned on, the invalid level V2' of the second output node N2 is transmitted to the fourth output node N4, and the signal of the fourth output node N4 will then jump to the invalid level V4', and V4=V2'. It should be noted that, in other embodiments, the valid level V5 of the auxiliary control signal Conx may also be a high level, and the second auxiliary transistor M23 may also be an N-type transistor.

In an embodiment, refer further to FIG. 11, the second auxiliary control unit 242 further includes an auxiliary storage capacitor C5, a first plate of the auxiliary storage capacitor C5 receives a fixed signal, and a second plate of the auxiliary storage capacitor C5 is electrically connected to the fourth output node N4.

Exemplarily, the auxiliary storage capacitor C5 can maintain the stability of the signal of the fourth output node N4, when the auxiliary control signal Conx is at the invalid level V5', so that the scanning module 250 can continuously output the second level signal VGL as the scanning signal GOUT, which facilitates improving the stability of the scanning signal GOUT. In an embodiment, the first plate of the auxiliary storage capacitor C5 can receive the first level signal VGH, the second level signal VGL, the first fixed signal VGH', or the second fixed signal VGL'.

Figure 12:
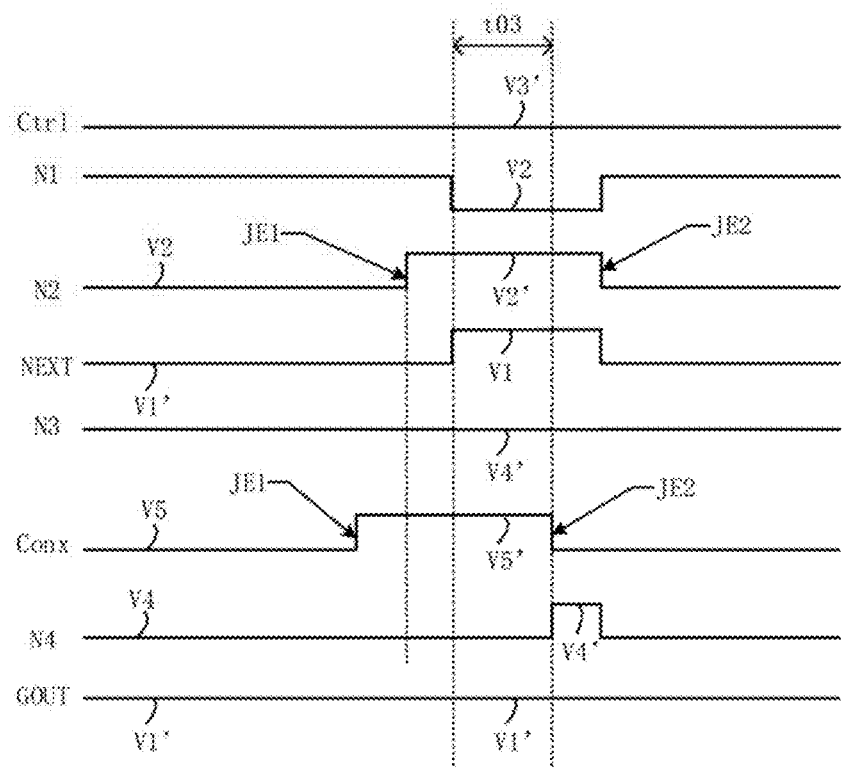
FIG. 12 is a timing diagram of another shift register unit in accordance with an embodiment of the present disclosure.

Based on the embodiments above, FIG. 12 is a timing diagram of another shift register unit in accordance with an embodiment of the present disclosure. Refer to FIG. 12, in the same shift register unit 20, the valid duration of the auxiliary control signal Conx overlaps with the valid duration of the signal of the second output node N2. The signal of the second output node N2 and the auxiliary control signal Conx both include a first transition edge JE1 that jumps from a valid level to an invalid level, and a second transition edge JE2 that jumps from an invalid level to a valid level. In the same shift register unit 20, the first transition edge JE1 of the signal of the second output node N2 is located between the first transition edge JE1 and the second transition edge JE2 of the auxiliary control signal Conx.

Exemplarily, taking the transmission control signal Ctrl to be at the non-enabling level V3' and the third output node N3 to be at the invalid level V4', refer to FIG. 11 and FIG. 12, the signal of the fourth output node N4 is affected by the auxiliary control signal Conx and the signal of the second output node N2. Before the first transition edge JE1 of the auxiliary control signal Conx, the auxiliary control signal Conx is at the valid level V5, and the signal of the second output node N2 is at the valid level V2, so that the second auxiliary transistor M23 in the auxiliary control module 240 is turned on, the valid level V2 of the second output node N2 is transmitted to the fourth output node N4, and the signal of the fourth output node N4 can be at the valid level V4 (V4=V2). When the auxiliary control signal Conx jumps from the valid level V5 to the invalid level V5', the second auxiliary transistor M23 is turned off and the signal of the fourth output node N4 can continue to maintain the valid level V4 (V4=V2). It is not until the auxiliary control signal Conx jumps from the invalid level V5' to the valid level V5 that the signal of the fourth output node N4 may change.

Refer further to FIG. 11 and FIG. 12, the first transition edge JE1 of the signal of the second output node N2 is located after the first transition edge JE1 of the auxiliary control signal Conx, which can ensure that when the auxiliary control signal Conx jumps from the valid level V5 to the invalid level V5', the signal of the second output node N2 is at the valid level V2. In this way, when the second auxiliary transistor M23 is turned off, the signal of the fourth output node N4 can be maintained at the valid level V4, increasing the valid duration of the signal of the fourth output node N4 to avoid the signal of the fourth output node N4 being maintained at the invalid level V4' when the second auxiliary transistor M23 is turned off, which would result in a longer floating time of the scanning signal GOUT and the instability of the second level V1' of the scanning signal GOUT, affecting the display effect.

Moreover, the first transition edge JE1 of the signal of the second output node N2 is located before the second transition edge JE2 of the auxiliary control signal Conx, so that the invalid duration of the auxiliary control signal Conx overlaps with the invalid duration of the second output node N2. When the auxiliary control signal Conx is invalid, the signal of the fourth output node N4 is maintained at the valid level V4, so that during at least part of the invalid duration of the second output node N2, the signal of the fourth output node N4 can be at the valid level V4, so that the scanning module 250 can control the scanning signal GOUT to be at the second level V1' according to the valid level V4 of the fourth output node N4. During this part of the duration, the scanning signal GOUT is an active signal, which facilitates the stability of the scanning signal GOUT, especially the stability of the scanning signal GOUT when it is at the second level V1'.

Figure 13:
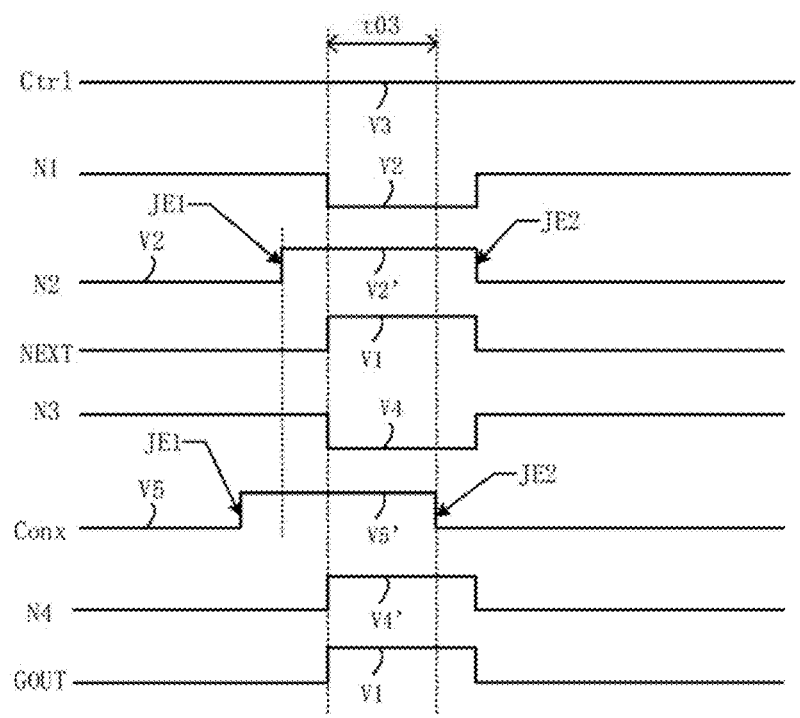
FIG. 13 is a timing diagram of another shift register unit in accordance with an embodiment of the present disclosure.

In an embodiment, FIG. 13 is a timing diagram of another shift register unit in accordance with an embodiment of the present disclosure. Refer to FIG. 12 and FIG. 13, in the same shift register unit 20, the invalid duration of the auxiliary control signal Conx overlaps with the valid duration of the first output node N1.

Exemplarily, taking the transmission control signal Ctrl to be at the non-enabling level V3' and the third output node N3 to be at the invalid level V4', referring to FIG. 12, the signal of the fourth output node N4 is affected by the auxiliary control signal Conx and the signal of the second output node N2. In the t03 phase, the auxiliary control signal Conx is at the invalid level V5', and the signal of the first output node N1 is at the valid level V2. As can be seen from the above description, when the auxiliary control signal Conx is at the invalid level V5', the signal of the fourth output node N4 can be maintained at the valid level V4, so that the scanning module 250 can control the scanning signal GOUT to be at the second level V1' according to the valid level V4 of the fourth output node N4. When the signal of the first output node N1 is at the valid level V2, the stage transfer module 220 can control the stage transfer signal NEXT to be at the first level V1 according to the valid level V2 of the first output node N1. Therefore, the invalid duration of the auxiliary control signal Conx overlaps with the valid duration of the first output node N1, and when the stage transfer module 220 outputs a valid pulse of the stage transfer signal NEXT and the scanning module 250 does not output a valid pulse of the scanning signal GOUT, the signal of the fourth output node N4 will be at the valid level V4 at least part of the time. The scanning module 250 can control the scanning signal GOUT to be at the second level V1' according to the valid level V4 of the fourth output node N4, which facilitates the stability of the scanning signal GOUT.

Taking the transmission control signal Ctrl to be at the enabling level V3 as an example, refer to FIG. 13, when the signal of the first output node N1 is at the valid level V2, the stage transfer signal NEXT is at the first level V1. Under the control of the transmission control signal Ctrl and the stage transfer signal NEXT, the transmission control module 230 can control the third output node N3 to also jump to the valid level V4 synchronously, and the first auxiliary transistor M24 in the auxiliary control module 240 is turned on, so that the signal of the fourth output node N4 is at the invalid level V4'. At this moment, no matter what level the auxiliary control signal Conx is at, and what level the signal of the second output node N2 is at, the signal of the fourth output node N4 will be at the invalid level V4', so that the scanning signal GOUT can be synchronized with the stage transfer signal NEXT, and both are at the first level V1. In this way, the auxiliary control module 240 maintains the stability of the second level V1' of the scanning signal GOUT of the shift register unit 20, and does not affect the normal jump of the scanning signal GOUT of the shift register unit 20 to the first level V1, so as to ensure the normal display function of the display panel.

Figure 14:
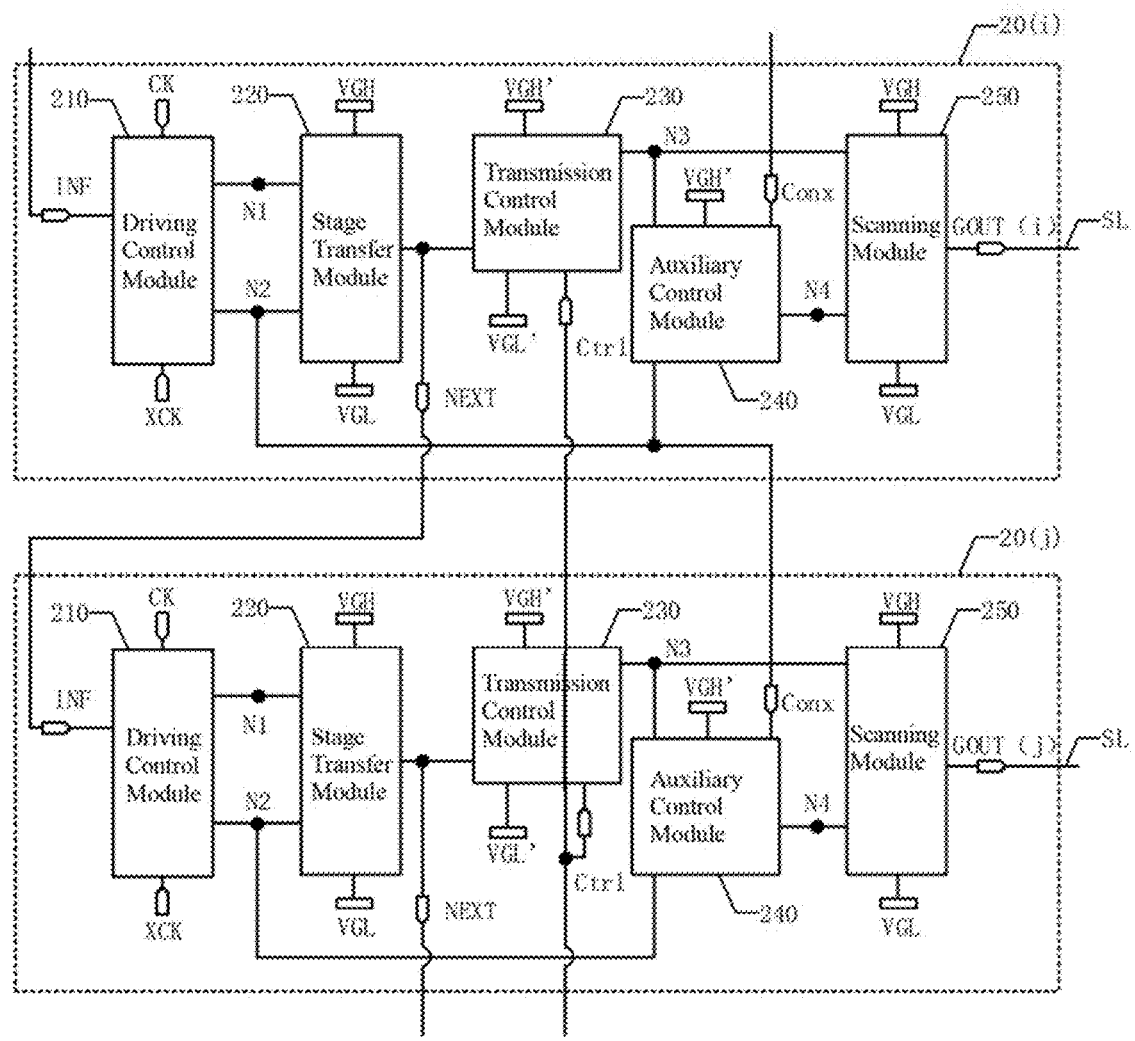
FIG. 14 is a schematic diagram of another shift register unit in accordance with an embodiment of the present disclosure.

In another embodiment, FIG. 14 is a schematic diagram of another shift register unit in accordance with an embodiment of the present disclosure. Refer to FIG. 14, the auxiliary control signal Conx of the j-th shift register unit 20(j) multiplexes the signal of the second output node N2 of the i-th shift register unit 20(i), where i≠j, and i and j are both positive integers.

Exemplarily, taking j=i+1 as an example, refer to FIG. 12 and FIG. 14, the auxiliary control signal Conx of the first level shift register unit 20 is the auxiliary start signal. Starting from the second level shift register unit 20, the auxiliary control signal Conx multiplexes the signal of the second output node N2 of the cascaded previous level shift register unit 20. Therefore, in the same shift register unit 20, the first transition edge JE1 of the auxiliary control signal Conx is located before the first transition edge JE1 of the signal of the second output node N2, and the second transition edge JE2 of the auxiliary control signal Conx is located before the second transition edge JE2 of the signal of the second output node N2. Further, because the first transition edge JE1 of the signal of the second output node N2 is located between the first transition edge JE1 and the second transition edge JE2 of the auxiliary control signal Conx, the invalid duration of the auxiliary control signal Conx overlaps with the invalid duration of the signal of the second output node N2. In this way, when the transmission control signal Ctrl is at the non-enabling level V3' and the stage transfer signal NEXT is at the first level V1, it can be implemented that the signal of the second output node N2 is at the invalid level V2' for at least part of the time, so that the fourth output node N4 is at the valid level V4, which facilitates the stability of the scanning signal GOUT, especially the stability when the scanning signal GOUT is at the second level V1'. Moreover, by multiplexing the signal of the second output node N2 of the cascaded previous phase shift register unit 20 into the auxiliary control signal Conx of the current level, it facilitates reducing the signals that the driving circuit 10 needs to receive, thereby simplifying timing and reducing the costs and cycle length of R&D.

Figure 15:
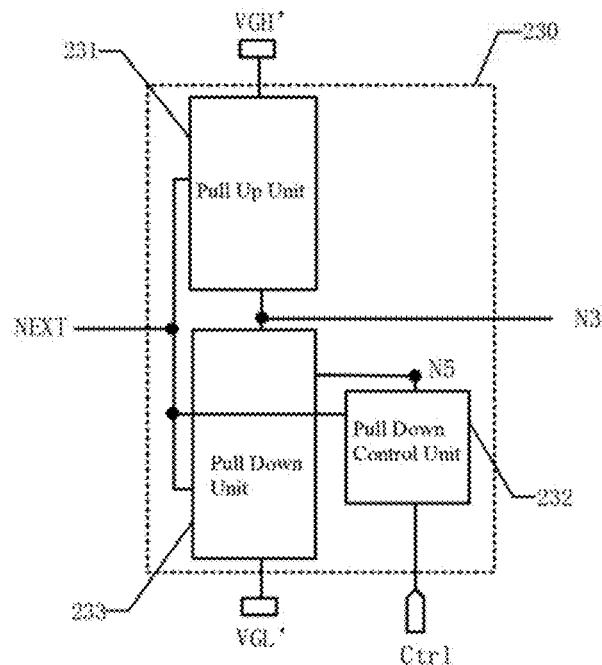
FIG. 15 is a schematic diagram of the structure of a transmission control module in accordance with an embodiment of the present disclosure.

Optionally, FIG. 15 is a schematic diagram of a transmission control module in accordance with an embodiment of the present disclosure. Refer to FIG. 15, the transmission control module 230 includes a pull-up unit 231, a pull-down control unit 232 and a pull-down unit 233. The pull-up unit 231 is configured to receive the stage transfer signal NEXT and the first fixed signal VGH', and control the signal of the third output node N3. The pull-down control unit 232 is configured to receive the stage transfer signal NEXT and the transmission control signal Ctrl, and control the signal of a pull-down control node N5. The pull-down unit 233 is configured to receive the stage transfer signal NEXT, the signal of the pull-down control node N5 and the second fixed signal VGL', and control the signal of the third output node N3.

The first fixed signal VGH' is at the invalid level V4' of the third output node N3 and the second fixed signal VGL' is at the valid level V4 of the third output node N3.

Exemplarily, taking the potential of the first fixed signal VGH' to be a high level and the potential of the second fixed signal VGL' to be a low level, when the stage transfer signal NEXT is at the second level V1', the pull-up unit 231 can pull up the signal of the third output node N3 to an invalid level V4' to ensure that the scanning module 250 does not control the scanning signal GOUT to be at the first level V1, thereby avoiding a situation where the stage transfer module 220 does not output a valid pulse of the stage transfer signal NEXT, while the scanning module 250 outputs a valid pulse of the scanning signal GOUT, which would result in display abnormality.

When the stage transfer signal NEXT jumps to the first level V1, if the transmission control signal Ctrl is at the enabling level V3, the pull-down control unit 232 can control the signal of the pull-down control node N5 to be at the enabling level V3 of the transmission control signal Ctrl, so that when the stage transfer signal NEXT is at the first level V1, the pull-down unit 233 can pull down the signal of the third output node N3 to the valid level V4, thereby controlling the scanning module 250 to output the first level V1 of the scanning signal GOUT, and the scanning signal GOUT is synchronized with the stage transfer signal NEXT to be at the first level V1. When the stage transfer signal NEXT jumps to the first level V1, if the transmission control signal Ctrl is at the non-enabling level V3', the pull-down control unit 232 can control the signal of the pull-down control node N5 to be at the non-enabling level V3' of the transmission control signal Ctrl, so that when the stage transfer signal NEXT is at the first level V1, the pull-down unit 233 cannot pull down the signal of the third output node N3 to the valid level V4, and the third output node N3 continues to maintain the invalid level V4'. The control scanning module 250 cannot output the first level V1 of the scanning signal GOUT, the scanning signal GOUT is at the second level V1', and the scanning signal GOUT is not synchronized with the stage transfer signal NEXT.

By configuring a pull-up unit 231 and a pull-down unit 233 in the transmission control module 230, the signal of the third output node N3 can be controlled to be an invalid level V4' and a valid level V4 respectively. By configuring a pull-down control unit 232, the signal of the pull-down control node N5 can be controlled, thereby controlling whether the pull-down unit 233 can pull down the signal of the third output node N3 to be a valid level V4, and indirectly controlling whether the scanning signal GOUT can be a first level V1. By configuring the pull-down control unit 232, the potential of the transmission control signal Ctrl can also be temporarily stored in the pull-down control node N5, so that when switching between the refresh phase and the holding phase of the first display frame, when the transmission control signal Ctrl jumps, it can be ensured that the signal of the pull-down control node N5 of the shift register unit 20 being driven will not jump with the transmission control signal Ctrl, thereby ensuring the stability of the third output node N3, which facilitates the integrity and accuracy of the scanning signal GOUT.

Figure 16:
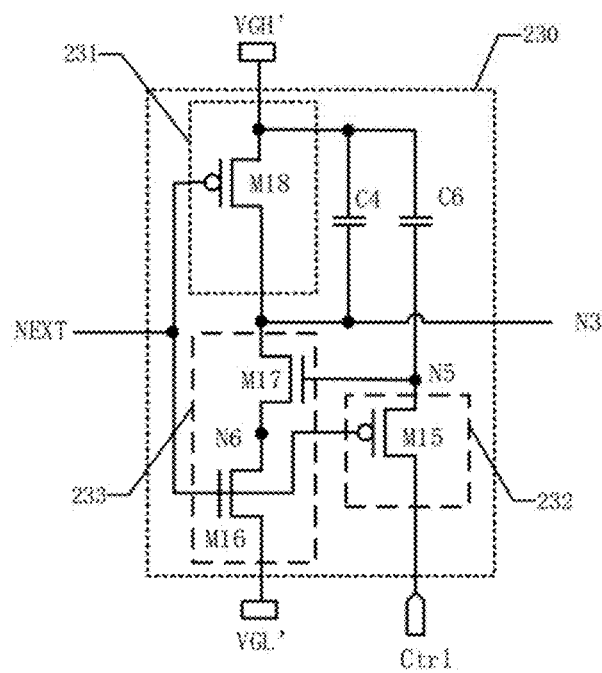
FIG. 16 is a schematic diagram of another transmission control module in accordance with an embodiment of the present disclosure.

In an embodiment, FIG. 16 is a schematic diagram of another transmission control module in accordance with an embodiment of the present disclosure. Refer to FIG. 16, the pull-up unit 231 includes a pull-up transistor M18. A gate of the pull-up transistor M18 receives the stage transfer signal NEXT, a first electrode of the pull-up transistor M18 receives the first fixed signal VGH', and a second electrode of the pull-up transistor M18 is electrically connected to the third output node N3.

Specifically, the pull-up transistor M18 can be turned on or off under the control of the stage transfer signal NEXT and the first fixed signal VGH', and when the pull-up transistor M18 is turned on, the first fixed signal VGH' can be transmitted to the third output node N3. The pull-up transistor M18 can be an N-type transistor or a P-type transistor. The type of transistor can be configured according to actual needs, and is not limited by embodiments of the present disclosure.

Exemplarily, taking the first level V1 of the stage transfer signal NEXT to be a high level, the second level V1' of the stage transfer signal NEXT to be a low level, and the pull-up transistor M18 to be a P-type transistor, when the stage transfer signal NEXT is at the second level V1', the pull-up transistor M18 is turned on, and the third output node N3 is the first fixed signal VGH', that is, the invalid level V4', so that the scanning signal GOUT is also at the second level V1'. This ensures that when the stage transfer signal NEXT is at the second level V1', the scanning signal GOUT will not be at the first level V1. It should be noted that in other embodiments, the first level V1 of the stage transfer signal NEXT may also be a low level, the second level V1' of the stage transfer signal NEXT may also be a high level, and the pull-up transistor M18 may be an N-type transistor.

In another embodiment, refer further to FIG. 16, the pull-down control unit 232 includes a pull-down control transistor M15. A gate of the pull-down control transistor M15 receives the stage transfer signal NEXT, a first electrode of the pull-down control transistor M15 receives the transmission control signal Ctrl, and a second electrode of the pull-down control transistor M15 is electrically connected to the pull-down control node N5.

Specifically, the pull-down control transistor M15 can be turned on or off under the control of the stage transfer signal NEXT and the transmission control signal Ctrl, and when the pull-down control transistor M15 is turned on, the transmission control signal Ctrl can be transmitted to the pull-down control node N5. The pull-down control transistor M15 can be an N-type transistor or a P-type transistor. The type of transistor can be configured according to actual needs, and is not limited by embodiments of the present disclosure.

Figure 17:
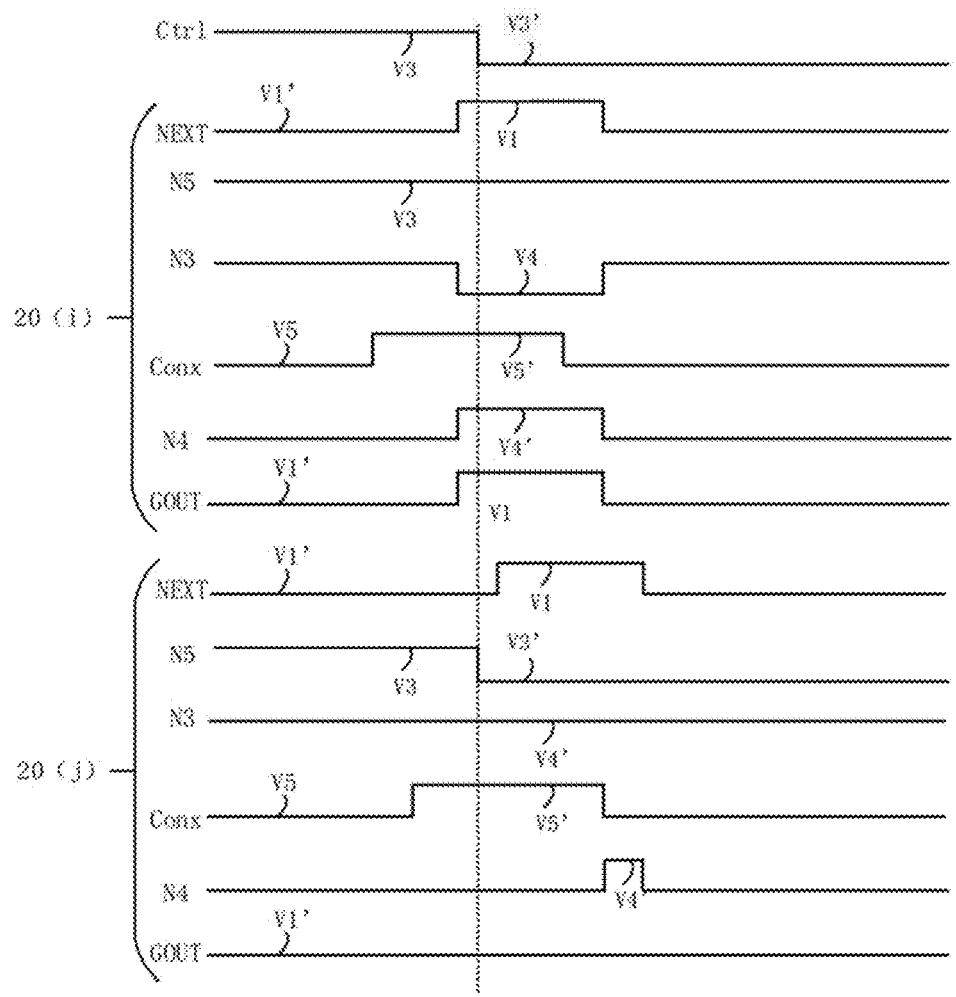
FIG. 17 is a timing diagram of another shift register unit in accordance with an embodiment of the present disclosure.

Exemplarily, the transmission control signals Ctrl received by the shift register units 20 at each level can be multiplexed, that is, the shift register units 20 at each level can receive the same transmission control signal Ctrl, as shown in FIG. 14. Taking the first level V1 of the stage transfer signal NEXT to be a high level, the second level V1' of the stage transfer signal NEXT to be a low level, and the pull-down control transistor M15 to be a P-type transistor as an example, FIG. 17 is a timing diagram of another shift register unit in accordance with an embodiment of the present disclosure. Refer to FIG. 14, FIG. 16 and FIG. 17, when the stage transfer signal NEXT of the i-th stage shift register unit 20(i) is at the second level V1', the pull-down control transistor M15 is turned on, and the transmission control signal Ctrl is transmitted to the pull-down control node N5, so that the pull-down control node N5 is the enabling level V3 of the transmission control signal Ctrl. When the stage transfer signal NEXT is at the first level V1, the pull-down control transistor M15 is turned off, and the pull-down control node N5 continues to maintain the enabling level V3 of the transmission control signal Ctrl. The pull-down unit 233 is controlled by the stage transfer signal NEXT and the signal of the pull-down control node N5, and the signal of the third output node N3 can be pulled down to the valid level V4. The scanning module 250 controls the scanning signal GOUT to be at the first level V1, and the scanning signal GOUT is synchronized with the stage transfer signal NEXT, both of which are at the first level V1.

Refer further to FIG. 14, FIG. 16 and FIG. 17, after the stage transfer signal NEXT of the i-th stage shift register unit 20(i) jumps to the first level V1, the transmission control signal Ctrl jumps from the enabling level V3 to the non-enabling level V3'. At this moment, the stage transfer signal NEXT of the j-th stage shift register unit 20(j) is at the second level V1', the pull-down control transistor M15 is turned on, the transmission control signal Ctrl is transmitted to the pull-down control node N5, and the signal of the pull-down control node N5 of the j-th stage shift register unit 20(j) also jumps from the enabling level V3 to the non-enabling level V3'. When the stage transfer signal NEXT of the j-th stage shift register unit 20(j) is at the first level V1, the pull-down control transistor M15 is turned off, and the pull-down control node N5 continues to maintain the non-enabling level V3' of the transmission control signal Ctrl. The pull-down unit 233 is controlled by the signal of the pull-down control node N5 and does not pull down the signal of the third output node N3. The third output node N3 is still at the invalid level V4', the scanning module 250 does not control the scanning signal GOUT to be at the first level V1, the scanning signal GOUT can continue to be maintained at the second level V1', and the scanning signal GOUT is not synchronized with the stage transfer signal NEXT.

In this way, when the i-th stage shift register unit 20(i) outputs the first level V1 of the stage transfer signal NEXT, the pull-down control transistor M15 can be controlled to be in the off state, so that the pull-down control node N5 continues to maintain the enabling level V3 of the transmission control signal Ctrl. After the stage transfer signal NEXT of the i-th stage shift register unit 20(i) jumps to the first level, no matter how the transmission control signal Ctrl changes, it can be guaranteed that the i-th stage shift register unit 20(i) will output a complete valid pulse of the scanning signal GOUT.

In another embodiment, refer further to FIG. 16, the pull-down unit 233 includes a pull-down transistor M16 and a gate transistor M17. A gate of the pull-down transistor M16 receives the stage transfer signal NEXT, a first electrode of the pull-down transistor M16 receives the second fixed signal VGL', and a second electrode of the pull-down transistor M16 is electrically connected to a first electrode of the gate transistor M17. A gate of the gate transistor M17 is electrically connected to the pull-down control node N5, a second electrode of the gate transistor M17 is electrically connected to the third output node N3. The channel type of the pull-up transistor M18 is opposite to the channel type of the pull-down transistor M16.

The second fixed signal VGL' is the valid level V4 of the third output node N3.

Exemplarily, taking the first level V1 of the stage transfer signal NEXT to be a high level, the second level V1' of the stage transfer signal NEXT to be a low level, the pull-up transistor M18 to be a P-type transistor, and the pull-down transistor M16 to be an N-type transistor, when the stage transfer signal NEXT is at the first level V1, the pull-down transistor M16 is turned on. If the signal of the pull-down control node N5 is at the enabling level V3 of the transmission control signal Ctrl, then the gate transistor M17 is turned on, and the signal of the third output node N3 can be pulled down to the valid level V4, so that the scanning module 250 controls the scanning signal GOUT to be at the first level V1. In this phase, the pull-up transistor M18 is turned off to ensure that the signal of the third output node N3 will not be at the invalid level V4', so as not to affect the potential of the scanning signal GOUT.

When the stage transfer signal NEXT is at the second level V1', the pull-up transistor M18 is turned on, the signal of the third output node N3 is at the invalid level V4', and the scanning module 250 cannot control the scanning signal GOUT to be at the first level V1 so that the scanning signal GOUT is also at the second level V1'. In this phase, the pull-down transistor M16 is turned off to ensure that the signal of the third output node N3 will not be at the valid level V4, so as not to affect the potential of the scanning signal GOUT. In other embodiments, the pull-up transistor M18 may also be an N-type transistor, and the pull-down transistor M16 may also be a P-type transistor.

Figure 18:
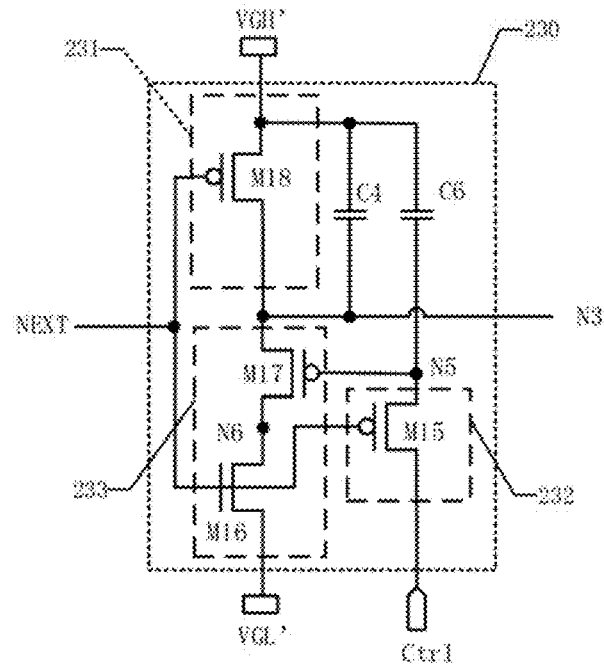
FIG. 18 is a schematic diagram of another transmission control module in accordance with an embodiment of the present disclosure.

In an embodiment, refer further to FIG. 16, the selection transistor M17 may be an N-type transistor, in which case the enabling level V3 of the transmission control signal Ctrl is a high level, and the non-enabling level V3' of the transmission control signal Ctrl is a low level. In another embodiment, FIG. 18 is a schematic diagram of another transmission control module in accordance with an embodiment of the present disclosure. Refer to FIG. 18, the selection transistor M17 may also be a P-type transistor, in which case the enabling level V3 of the transmission control signal Ctrl is a low level, and the non-enabling level V3' of the transmission control signal Ctrl is a high level.

In another embodiment, refer to FIG. 16 and FIG. 18, the transmission control module 230 further includes a first storage capacitor C4. A first plate of the first storage capacitor C4 receives a fixed signal, and a second plate of the first storage capacitor C4 is electrically connected to the third output node N3. In an embodiment, the first plate of the first storage capacitor C4 can receive the first level signal VGH, the second level signal VGL, the first fixed signal VGH', or the second fixed signal VGL'. Exemplarily, the first storage capacitor C4 can be used when the stage transfer signal NEXT is at the first level V1 and the signal of the pull-down control node N5 is at the non-enabling level V3' of the transmission control signal Ctrl. That is, when the pull-up transistor M18 and the gate transistor M17 are both turned off and the third output node N3 is floating, the stability of the third output node N3 is maintained.

In another embodiment, refer to FIG. 16 and FIG. 18, the transmission control module further includes a second storage capacitor C6. A first plate of the second storage capacitor C6 receives a fixed signal, a second plate of the second storage capacitor C6 is electrically connected to the pull-down control node N5. In an embodiment, the first plate of the second storage capacitor C6 can receive the first level signal VGH, the second level signal VGL, the first fixed signal VGH', or the second fixed signal VGL'. Exemplarily, the second storage capacitor C6 can maintain the stability of the pull-down control node N5 when the stage transfer signal NEXT is at the first level V1, that is, when the pull-down control transistor M15 is turned off and the pull-down control node N5 is floating.

Figure 19:
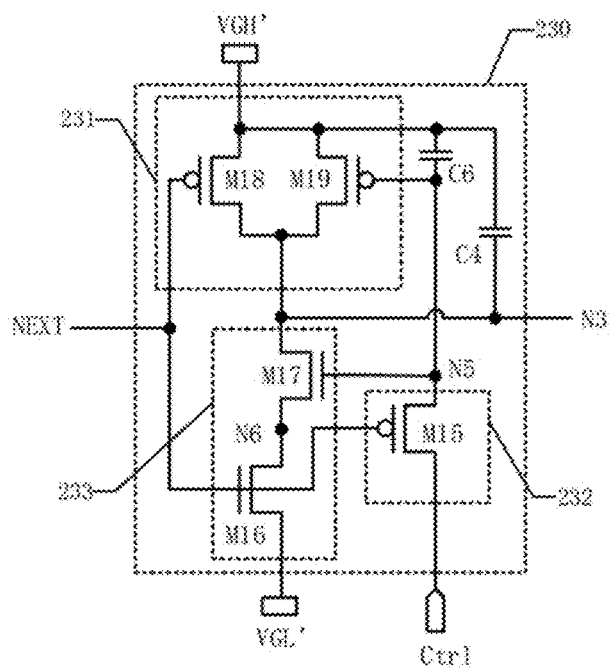
FIG. 19 is a schematic diagram of the structure of another transmission control module in accordance with an embodiment of the present disclosure.

In another embodiment, FIG. 19 is a schematic diagram of another transmission control module in accordance with an embodiment of the present disclosure. Refer to FIG. 19, the pull-up unit 231 further includes a pull-up auxiliary transistor M19. A gate of the pull-up auxiliary transistor M19 is electrically connected to the pull-down control node N5, a first electrode of the pull-up auxiliary transistor M19 receives the first fixed signal VGH', and a second electrode of the pull-up auxiliary transistor M19 is electrically connected to the third output node. The channel type of the pull-up auxiliary transistor M19 is opposite to the channel type of the gate transistor M17.

Exemplarily, taking the enabling level V3 of the transmission control signal Ctrl to be a high level, the non-enabling level V3' of the transmission control signal Ctrl to be a low level, the pull-up auxiliary transistor M19 to be a P-type transistor, and the gate transistor M17 to be an N-type transistor, when the signal of the pull-down control node N5 is at the enabling level V3 of the transmission control signal Ctrl, the gate transistor M17 is turned on, and the pull-up auxiliary transistor M19 is turned off. If the stage transfer signal NEXT is at the first level V1, the third output node N3 can be pulled down to the valid level V4 by the gate transistor M17 and the pull-down transistor M16, so that the scanning signal GOUT is also at the first level V1. When the signal of the pull-down control node N5 is at the non-enabling level V3' of the transmission control signal Ctrl, the gate transistor M17 is turned off, and the pull-up auxiliary transistor M19 is turned on, so that the signal of the third output node N3 is always at the invalid level V4', maintaining the stability of the signal of the third output node N3, and ensuring that the scanning signal GOUT will not be at the first level V1, so as to implement low-frequency refresh of part of the pixels.

Figure 20:
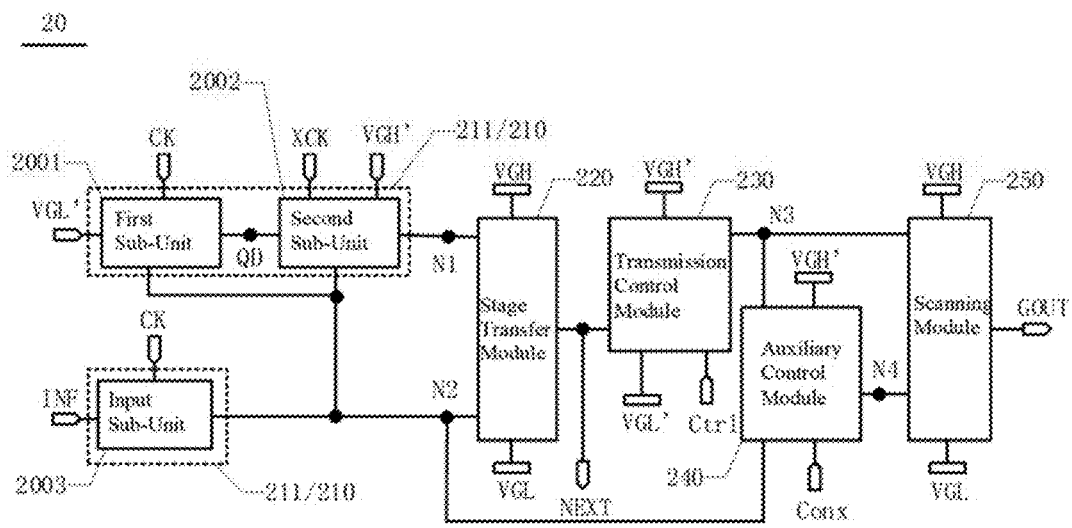
FIG. 20 is a schematic diagram of another shift register unit in accordance with an embodiment of the present disclosure.

Optionally, FIG. 20 is a schematic diagram of another shift register unit in accordance with an embodiment of the present disclosure. Refer to FIG. 20, the driving control module 210 includes a first driving unit 211 and a second driving unit 212. The first driving unit 211 is configured to receive the signal of the second output node N2, the first fixed signal VGH', the second fixed signal VGL', a first clock signal CK and a second clock signal XCK, and control the signal of the first output node N1. The second driving unit 212 is configured to receive the input signal INF, the first clock signal CK, and control the signal of the second output node N2.

The first clock signal CK can be a pulse signal that alternates between a high level and a low level. Similarly, the second clock signal XCK can also be a pulse signal that alternates between a high level and a low level. Usually, a high level and a consecutive low level constitute a pulse cycle. The second clock signal XCK and the first clock signal CK can differ by half a pulse cycle, that is, when the first clock signal CK is at a high level, the second clock signal XCK can be at a low level. Conversely, when the first clock signal CK is at a low level, the second clock signal XCK can be at a high level. It should be noted that the valid level and the invalid level of the first clock signal CK and the second clock signal XCK can be configured as needed, and is not limited by embodiments of the present disclosure. The first fixed signal VGH' can be the invalid level V2' of the first output node N1, and the second fixed signal VGL' can be the valid level V2 of the first output node N1. The first level V1 of the input signal INF can be the invalid level V2' of the second output node N2, and the second level V1' of the input signal INF can be the valid level V2 of the second output node N2. In an embodiment, the potential of the first fixed signal VGH' and the first level V1 are both high levels, and the potential of the second fixed signal VGL' and the second level V1' are both low levels.

Exemplarily, the first driving unit 211 can control the signal of the first output node N1 under the control of the signal of the second output node N2, the first fixed signal VGH', the second fixed signal VGL', the first clock signal CK and the second clock signal XCK, so that when the input signal INF is at the first level V1 and the signal of the second output node N2 is at the invalid level V2'. The signal of the first output node N1 can be controlled to be at the valid level V2, so that the stage transfer module 220 can output the first level signal VGH as the stage transfer signal NEXT, and the stage transfer signal NEXT is also at the first level V1. In this way, the stage transfer signal NEXT can be used as the input signal INF of the next shift register unit 20, and the valid pulse of the input signal INF is shifted in sequence, that is, the shift register units 20 of each level are driven in sequence. The first level V1 can be the valid level of the input signal INF and the stage transfer signal NEXT, and the second level V1' can be the invalid level of the input signal INF and the stage transfer signal NEXT.

The second driving unit 212 can control the input signal INF to be transmitted to the second output node N2 under the control of the first clock signal CK, so that the signal of the second output node N2 matches the input signal INF. That is, when the input signal INF is at the first level V1, the signal of the second output node N2 may be at the invalid level V2' to prevent the stage transfer module 220 from outputting the second level signal VGL as the stage transfer signal NEXT, thereby preventing the input signal INF from jumping. After changing to the first level V1, the stage transfer signal NEXT is always at the second level V1', causing the input signal INF to be unable to be shifted and output.

In an embodiment, refer further to FIG. 20, the first driving unit 211 includes a first sub-unit 2001 and a second sub-unit 2002. The first sub-unit 2001 receives the signal of the second output node N2, the first clock signal CK and the second fixed signal VGL', and controls the signal of a driving node QD. The second sub-unit 2002 receives the signal of the second output node N2, the signal of the driving node QD, the second clock signal XCK, and the first fixed signal VGH', and controls the signal of the first output node N1.

Specifically, the first sub-unit 2001 can control the transmission path of the second fixed signal VGL' and/or the first clock signal CK to the driving node QD under the control of the signal of the second output node N2 and the first clock signal CK. The second sub-unit 2002 can control the transmission path of the first fixed signal VGH' and/or the second clock signal XCK to the first output node N1 under the control of the signal of the second output node N2, the signal of the driving node QD, and the second clock signal XCK, so that after the input signal INF jumps to the first level V1 and the signal of the second output node N2 jumps to the invalid level V2', the first output node N1 can jump to the valid level V2, and the jumping times of the two differ by half a pulse cycle. That is, after the input signal INF jumps to the first level V1, the stage transfer module 220 can control the stage transfer signal NEXT to jump to the first level V1 according to the valid level V2 of the first output node N1, and the jumping times of the two differ by half a pulse cycle, so as to implement the sequential shifting of the valid pulse of the input signal INF, that is, to implement the sequential driving of the shift register units 20 at each level.

Figure 21:
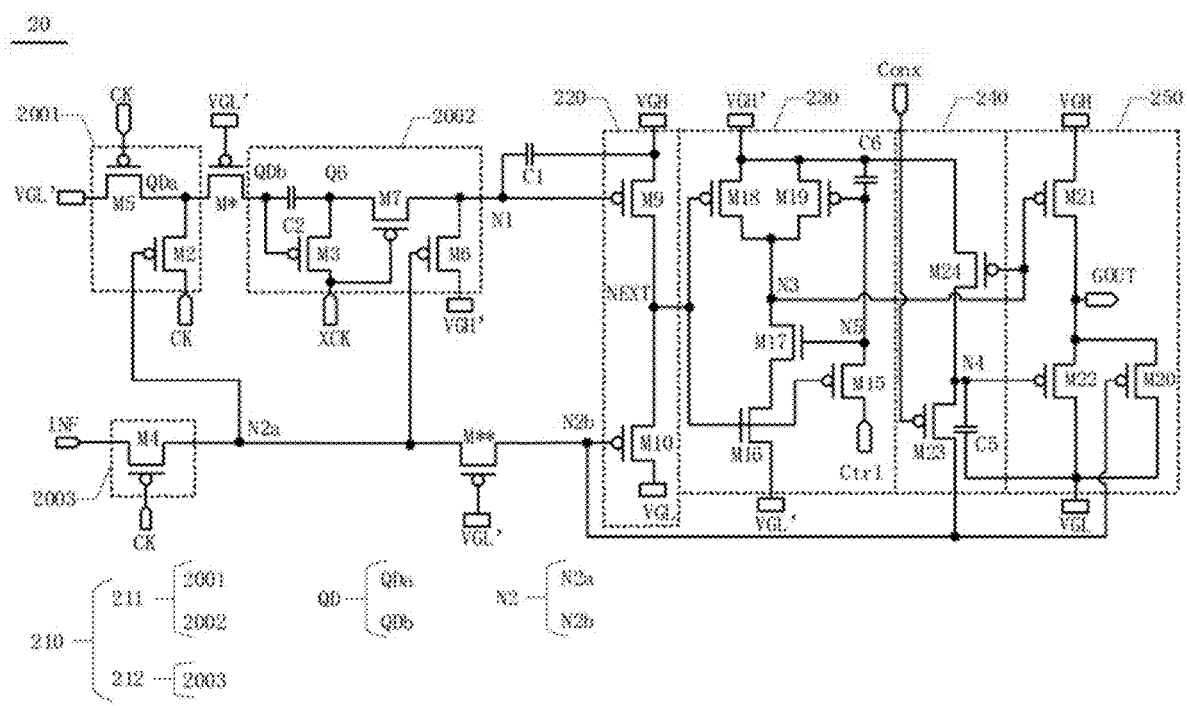
FIG. 21 is a schematic diagram of another shift register unit in accordance with an embodiment of the present disclosure.

In an embodiment, FIG. 21 is a schematic diagram of another shift register unit in accordance with an embodiment of the present disclosure. Refer to FIG. 21, the first sub-unit 2001 includes a first driving transistor M5 and a second driving transistor M2. A gate of the first driving transistor M5 receives the first clock signal CK, a first electrode of the first driving transistor M5 receives the second fixed signal VGL', and a second electrode of the first driving transistor M5 and a second electrode of the second driving transistor M2 are electrically connected to the driving node QD. A gate of the second driving transistor M2 is electrically connected to the second output node N2, and a first electrode of the second driving transistor M2 receives the first clock signal CK.

Specifically, the first driving transistor M5 can be turned on or off under the common control of the second fixed signal VGL' and the first clock signal CK, and when the first driving transistor M5 is turned on, the second fixed signal VGL' can be transmitted to the driving node QD. The second driving transistor M2 can be turned on or off under the common control of the signal of the second output node N2 and the first clock signal CK, and when the second driving transistor M2 is turned on, the first clock signal CK can be transmitted to the driving node QD. The first driving transistor M5 and the second driving transistor M2 may be N-type transistors or P-type transistors, which can be configured according to needs, and is not limited by embodiments of the present disclosure.

Exemplarily, taking the second fixed signal VGL' to be a low level, and the first driving transistor M5 and the second driving transistor M2 to be P-type transistors, when the first clock signal CK is at a low level, the first driving transistor M5 is turned on, and can transmit the second fixed signal VGL' to the driving node QD. At this moment, regardless of whether the second driving transistor M2 is turned on, the driving node QD is at a low level. When the first clock signal CK is at a high level, the first driving transistor M5 is turned off. If the signal of the second output node N2 is at an invalid level V2', and the second driving transistor M2 is also turned off, then the driving node QD can be maintained at a low level. If the signal of the second output node N2 is at a valid level V2, and the second driving transistor M2 is turned on, then the driving node QD can be at a high level.

In another embodiment, refer further to FIG. 21, the second sub-unit 2002 includes a second bootstrap capacitor C2, a third driving transistor M3, a fourth driving transistor M7 and a fifth driving transistor M6. A first electrode of the second bootstrap capacitor C2 and a gate of the third driving transistor M3 are electrically connected to the drive node QD, a first electrode of the third driving transistor M3 receives the second clock signal XCK, and a second electrode of the third driving transistor M3 is electrically connected to the second electrode of the second bootstrap capacitor C2 and the first electrode of the fourth driving transistor M7. A gate of the fourth driving transistor M7 receives the second clock signal XCK, and a second electrode of the fourth driving transistor M7 and the second electrode of the fifth driving transistor M6 are electrically connected to the first output node N1. A gate of the fifth driving transistor M6 is electrically connected to the second output node N2, and a first electrode of the fifth driving transistor M6 receives the first fixed signal VGH'.

Specifically, the third driving transistor M3 can be turned on or off under the control of the signal of the driving node QD, and when the third driving transistor M3 is turned on, the second clock signal XCK can be transmitted to the first electrode of the fourth driving transistor M7, that is, a sixth node Q6. The fourth driving transistor M7 can be turned on or off under the control of the second clock signal XCK, and when the fourth driving transistor M7 is turned on, the signal of the sixth node Q6 can be transmitted to the first output node N1. The fifth driving transistor M6 can be turned on or off under the control of the signal of the second output node N2 and the first fixed signal VGH', and when the fifth driving transistor M6 is turned on, the first fixed signal VGH' can be transmitted to the first output node N1. The second bootstrap capacitor C2 can maintain the potential difference between the driving node QD and the sixth node Q6 to ensure that the third driving transistor M3 is fully turned on and reduce signal delay. The first driving transistor M5 and the second driving transistor M2 can be N-type transistors or P-type transistors, which can be configured as needed, and is not limited by the embodiments of the present disclosure.

In another embodiment, refer further to FIG. 21, a first voltage stabilizing transistor M* may be further provided between the first sub-unit 2001 and the second sub-unit 2002, and the driving node QD includes a first driving sub-node QDa and a second driving sub-node QDb. A first electrode of the first voltage stabilizing transistor M* is electrically connected to the first sub-unit 2001 at the first driving sub-node QDa, a second electrode of the first voltage stabilizing transistor M* is electrically connected to the second sub-unit 2002 at the second driving sub-node QDb, and a gate of the first voltage stabilizing transistor M* receives a second fixed signal VGL'.

Exemplarily, take the first voltage-stabilizing transistor M* to be a P-type transistor as an example, the first voltage-stabilizing transistor M* can be in an on state under the control of the second fixed signal VGL', so that the potential of the first driving sub-node QDa and the second driving sub-node QDb are equivalent. Moreover, due to the existence of the threshold voltage of the first voltage-stabilizing transistor M*, the first voltage stabilizing transistor M* will be in an on state only when the difference between the second fixed signal VGL' and the potential at the first driving sub-node QDa or the second driving sub-node QDb electrically connected to the first voltage stabilizing transistor M* is less than the threshold voltage of the first voltage stabilizing transistor M*. When this condition is not met, the first voltage stabilizing transistor M* will be in an off state. In this way, the first voltage stabilizing transistor M* can protect the device electrically connected to the other node when the potential of one of the first driving sub-node QDa and the second driving sub-node QDb is abnormal.

In another embodiment, refer to FIG. 21, the shift register unit 20 further includes a third storage capacitor C1. A first plate of the third storage capacitor C1 receives a fixed signal, and a second plate of the third storage capacitor C1 is electrically connected to the first output node N1.

Specifically, the third storage capacitor C1 can maintain the signal stability of the first output node N1 when the fourth driving transistor M7 is turned off and/or the fifth driving transistor M6 is turned off, so that the stage transfer module 220 can continue to output the first level signal VGH as the stage transfer signal NEXT, which facilitates improving the stability of the stage transfer signal NEXT. In an embodiment, the first plate of the third storage capacitor C1 can receive the first level signal VGH, the second level signal VGL, the first fixed signal VGH', or the second fixed signal VGL'.

In another embodiment, refer further to FIG. 21, the second driving unit 212 includes an input sub-unit 2003, which is configured to receive the input signal INF and the first clock signal CK, and control the signal of the second output node N2. Specifically, the input sub-unit 2003 controls the transmission path of the input signal INF to the second output node N2 under the control of the first clock signal CK.

In an embodiment, the input sub-unit 2003 includes a first input transistor M4. A gate of the first input transistor M4 receives the first clock signal CK, a first electrode of the first input transistor M4 receives the input signal INF, and a second electrode of the first input transistor M4 is electrically connected to the second output node N2.

Specifically, the first input transistor M4 can be turned on or off under the control of the first clock signal CK, and when the first input transistor M4 is turned on, the input signal INF can be transmitted to the second output node N2. The first input transistor M4 can be an N-type transistor or a P-type transistor, which can be configured as needed, and is not limited by the embodiments of the present disclosure.

In another embodiment, refer further to FIG. 21, a second voltage stabilizing transistor M may be further provided between the first input transistor M4 and the stage transfer module 220, and the second output node N2 includes a first output sub-node N2a and a second output sub-node N2b. A first electrode of the second voltage stabilizing transistor M and a second electrode of the first input transistor M4 are electrically connected to the first output sub-node N2a, and a second electrode of the second voltage stabilizing transistor M and the stage transfer module 220 are electrically connected to the second output sub-node N2b. A gate of the second voltage stabilizing transistor M receives a second fixed signal VGL'. The second voltage-stabilizing transistor M** can protect the device electrically connected to the other node when the potential of one of the first output sub-node N2a and the second output sub-node N2b is abnormal.

Figure 22:
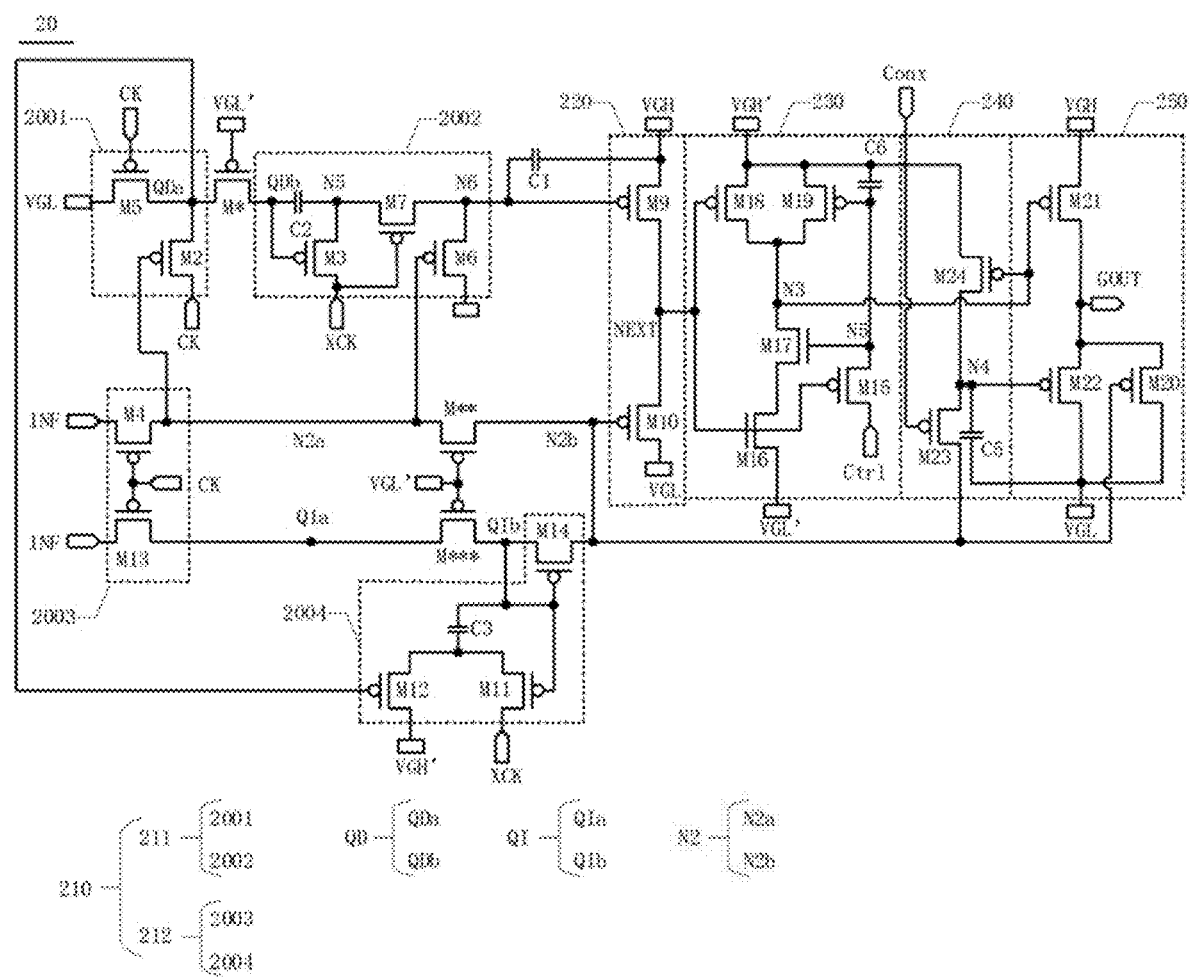
FIG. 22 is a schematic diagram of another shift register unit in accordance with an embodiment of the present disclosure.

In another embodiment, FIG. 22 is a schematic diagram of another shift register unit in accordance with an embodiment of the present disclosure. Refer to FIG. 22, the second driving unit 212 also includes a pull-down auxiliary sub-unit 2004. An input sub-unit 2003 is also configured to receive the input signal INF and the first clock signal CK, and control the signal of an input node QI. The pull-down auxiliary sub-unit 2004 is configured to receive the signal of the input node QI and the second clock signal XCK, and control the signal of the second output node N2.

Specifically, the input sub-unit 2003 controls the transmission path of the input signal INF to the input node QI under the control of the first clock signal CK. The pull-down auxiliary sub-unit 2004 can control the transmission path of the signal of the input node QI to the second output node N2 under the control of the signal of the input node QI and the second clock signal XCK. The pull-down auxiliary sub-unit 2004 can also assist in pulling down the signal of the second output node N2 when the input signal INF is at the second level V1' and the second output node N2 is the valid level V2, thereby increasing the charging speed of the stage transfer module 220. Accordingly, the stage transfer module 220 can control the stage transfer signal NEXT to quickly jump to the second level V1', so that the scanning module 250 can quickly recover to the invalid level after outputting the valid pulse of the scanning signal GOUT, thereby improving the response speed of the display panel. Moreover, when the pull-down auxiliary sub-unit 2004 assists in pulling down the signal of the second output node N2, the signal of the second clock signal XCK may affect the signal of the input node QI. The pull-down auxiliary sub-unit 2004 can also be configured to isolate the input node QI and the second output node N2, thereby avoiding fluctuations in the second output node N2 which would affect the display effect.

In an embodiment, refer further to FIG. 22, the input sub-unit 2003 further includes a second input transistor M13. A gate of the second input transistor M13 receives the first clock signal CK, a first electrode of the second input transistor M13 receives the input signal INF, and a second electrode of the second input transistor M13 is electrically connected to the input node QI. The pull-down auxiliary sub-unit 2004 includes a first pull-down auxiliary transistor M14, a second pull-down auxiliary transistor M11, and a first bootstrap capacitor C3. A gate of the first pull-down auxiliary transistor M14 and a first electrode of the first pull-down auxiliary transistor M14 are both electrically connected to the input node QI, and a second electrode of the first pull-down auxiliary transistor M14 is electrically connected to the second output node N2. A gate of the second pull-down auxiliary transistor M11 is electrically connected to the input node QI, a first electrode of the second pull-down auxiliary transistor M11 receives the second clock signal XCK, and a second electrode of the second pull-down auxiliary transistor M11 is electrically connected to the first electrode plate of the first bootstrap capacitor C3. A second electrode plate of the first bootstrap capacitor C3 is electrically connected to the input node QI.

Exemplarily, take the first level V1 of the input signal INF to be a high level, the second level V1' of the input signal INF to be a low level, and the first pull-down auxiliary transistor M14 and the second pull-down auxiliary transistor M11 to be P-type transistors, when the input signal INF is at the second level V1', if the first clock signal CK is at a low level, the second input transistor M13 is turned on, the input node QI can be a low level, and the first pull-down auxiliary transistor M14 and the second pull-down auxiliary transistor M11 are also turned on. At this moment, the second clock signal XCK is at a high level. If the first clock signal CK jumps from a low level to a high level, the second clock signal XCK jumps from a high level to a low level, the second input transistor M13 is turned off, the input node QI continues to maintain a low level, and the first pull-down auxiliary transistor M14 and the second pull-down auxiliary transistor M11 continue to be turned on. Under the coupling effect of the first bootstrap capacitor C3, the second clock signal XCK pulls down to drive the input node QI to further pull down, and the first pull-down auxiliary transistor M14 and the second pull-down auxiliary transistor M11 are turned on. The first pull-down auxiliary transistor M14 is turned on, so that the signal potential of the second output node N2 is pulled, which is conducive to the complete conduction of the second level transfer transistor M10 in the stage transfer module 220, so that the stage transfer module 220 can control the stage transfer signal NEXT to quickly jump to the second level V1'. The scanning module 250 can thus quickly recover to the invalid level after outputting the valid pulse of the scanning signal GOUT, thereby improving the response speed of the display panel. Moreover, when the second clock signal XCK jumps from a low level to a high level, under the coupling effect of the first bootstrap capacitor C3, the increase of the second clock signal XCK will drive the potential of the input node QI to increase. At this moment, the first pull-down auxiliary transistor M14 is turned off, and the fluctuation of the signal of the input node QI will not affect the second output node N2.

In another embodiment, refer further to FIG. 22, the pull-down auxiliary sub-unit 2004 also includes a third pull-down auxiliary transistor M12. A gate of the third pull-down auxiliary transistor M12 is electrically connected to the first driving unit 211, a first electrode of the third pull-down auxiliary transistor M12 receives the first fixed signal VGH', and a second electrode of the third pull-down auxiliary transistor M12 is electrically connected to the first electrode plate of the first bootstrap capacitor C3.

Exemplarily, take the first level V1 of the input signal INF to be a high level, the second level V1' of the input signal INF to be a low level, and the first pull-down auxiliary transistor M14, the second pull-down auxiliary transistor M11, and the third pull-down auxiliary transistor M12 to all be P-type transistors, when the input signal INF is at the first level V1, if the first clock signal CK is at a low level, the second input transistor M13 and the first driving transistor M5 are turned on. The input node QI can be a high level, the driving node QD can be a low level, the first pull-down auxiliary transistor M14 and the second pull-down auxiliary transistor M11 are turned off, and the third pull-down auxiliary transistor M12 is turned on. Under the coupling effect of the first bootstrap capacitor C3, the potential of the input node QI will be pulled up, so that the first pull-down auxiliary transistor M14 is completely turned off, which facilitates maintaining the stability of the second output node N2, thereby improving the stability of the first output node N1.

In another embodiment, refer to FIG. 22, a third voltage stabilizing transistor M* may be further provided between the input sub-unit 2003 and the second pull-down auxiliary sub-unit 2004. In this case, the input node QI includes a first input sub-node QIa and a second input sub-node QIb. A first electrode of the third voltage-stabilizing transistor M* and the input sub-unit 2003 are electrically connected to the first input sub-node QIa, and a second electrode of the third voltage-stabilizing transistor M* and the second pull-down auxiliary sub-unit 2004 are electrically connected to the second input sub-node QIb. A gate of the third voltage stabilizing transistor M* receives the second fixed signal VGL'. The third voltage stabilizing transistor M*** can protect the device electrically connected to the other node when the potential of one of the first input sub-node QIa and the second input sub-node QIb is abnormal.

The description above is an exemplary description of the driving circuits and the shift register units, but embodiments of the present disclosure are not limited by the driving circuits and the shift register units described therein. The following description is an exemplary description of pixels, and the connecting relationship between the pixels and the shift register units.

Figure 23:
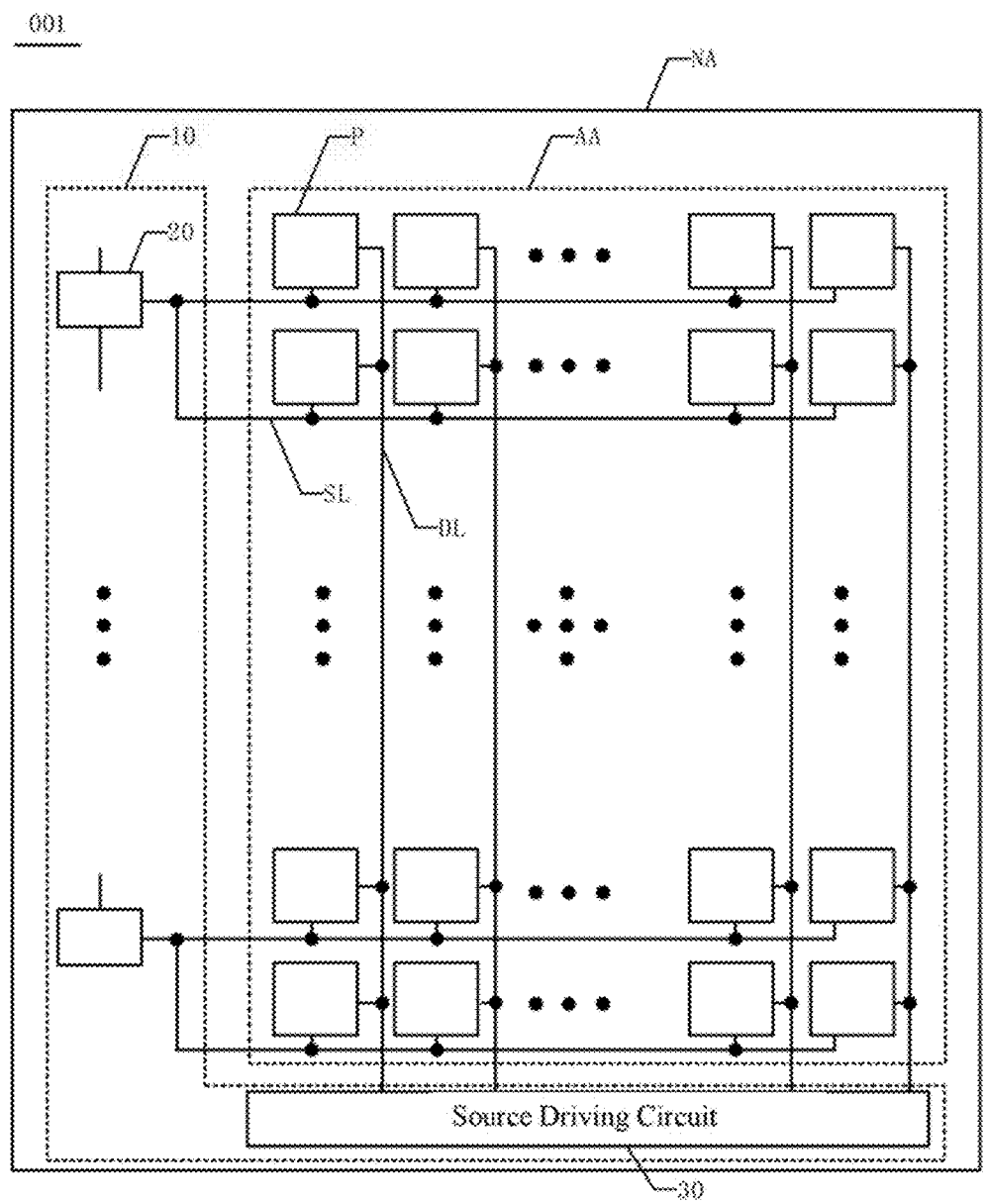
FIG. 23 is a schematic diagram of a top view of another display panel in accordance with an embodiment of the present disclosure.

Optionally, FIG. 23 is a schematic diagram of a top view of another display panel in accordance with an embodiment of the present disclosure. Refer to FIG. 23, a scanning module 250 of a shift register unit 20 is electrically connected to at least two scanning lines SL.

Exemplarily, each scan line SL can be electrically connected to all pixels P in the same row, and the scanning module 250 of each shift register unit 20 can be electrically connected to two SLs, so that the scan signal GOUT on the 2 k-th scan line SL can multiplex the scan signal GOUT on the (2 k−1)-th scan line SL, where k is a positive integer. In this way, the number of shift register units 20 can be reduced, which facilitates the narrow frame of the display panel 001.

Figure 24:
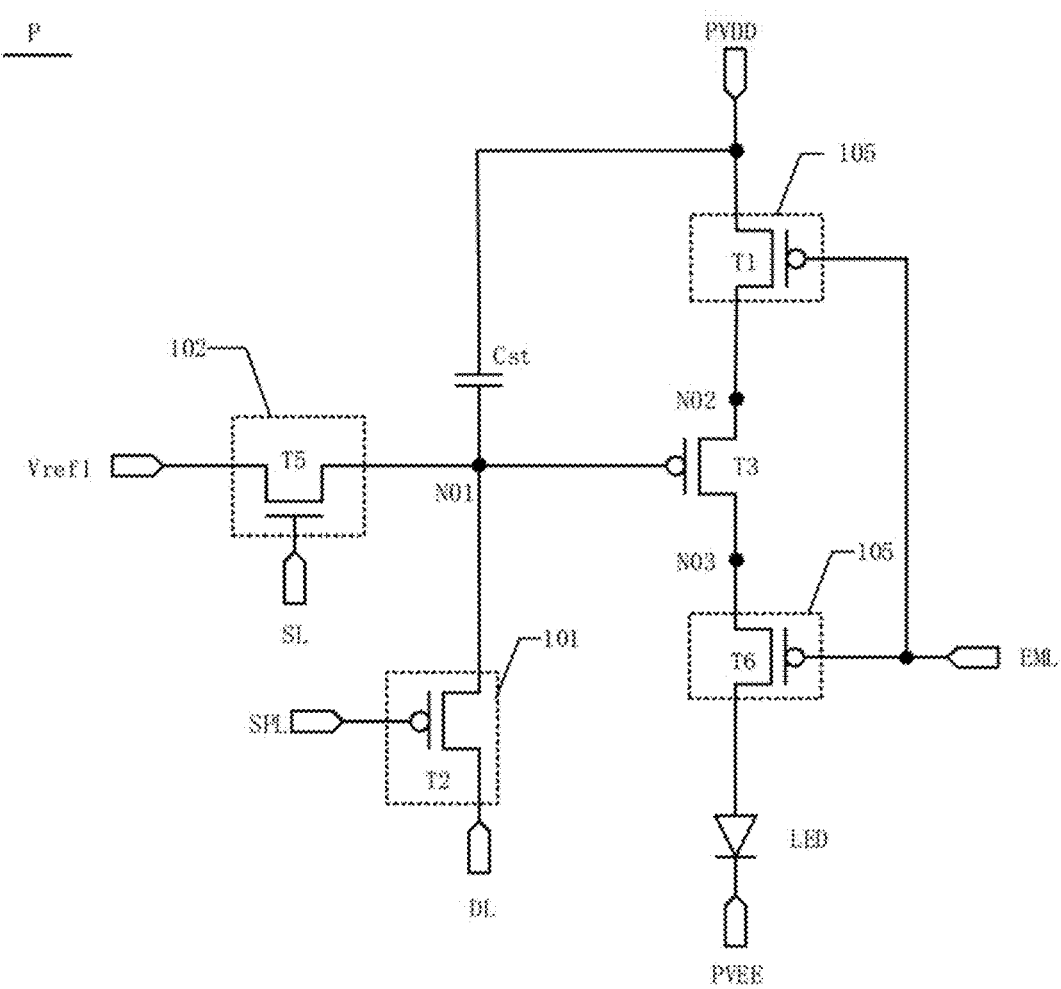
FIG. 24 is a schematic diagram of a circuit of a pixel in accordance with an embodiment of the present disclosure.

Optionally, FIG. 24 is a schematic diagram of a circuit structure of a pixel in accordance with an embodiment of the present disclosure. Refer to FIG. 24, the pixel P includes a driving transistor T3, a writing module 101, an initialization module 102, and a light-emitting element LED. The initialization module 102 and the writing module 101 are electrically connected to the driving transistor T3, respectively. The initialization module 102 is configured to receive at least a scanning signal GOUT, and initialize the gate of the driving transistor T3 according to the scanning signal GOUT, and the writing module 101 is configured to write the data signal Data to the gate of the driving transistor T3.

Exemplarily, the writing module 101 includes a writing transistor T2, where a first electrode of the writing transistor T2 is electrically connected to the data line DL to receive the data signal, a second electrode of the writing transistor T2 is electrically connected to the gate of the driving transistor T3 at the first node N01, and a gate of the writing transistor T2 can be electrically connected to the refresh control line SPL to receive the refresh control signal. The initialization module 102 includes an initialization transistor T5, where a first electrode of the initialization transistor T5 receives an initialization signal Vref1, a second electrode of the initialization transistor T5 is electrically connected to the gate of the driving transistor T3 at the first node N01, and the gate of the initialization transistor T5 can be electrically connected to the scanning line SL to receive the scanning signal GOUT. That is, the scanning signal GOUT output by the shift register unit 20 provided in an embodiment of the present disclosure can control the conduction or closing of the initialization transistor T5 in the pixel P. By improving the stability of the scanning signal GOUT, the fluctuation of the scanning signal GOUT which causes the initialization transistor T5 to be mis-turned on or mis-turned off can be avoided.

It should be noted that the writing transistor T2 and the initialization transistor T5 can be P-type transistors or N-type transistors. The type of transistor can be configured according to actual needs, which is not limited by the embodiments of the present disclosure.

In an embodiment, refer further to FIG. 24, the pixel P further includes a light-emitting control module 105, which is configured to control the driving transistor to provide a driving current to the light-emitting element LED, that is, to control the transmission path of the driving current to the light-emitting element LED. Exemplarily, the light-emitting control module 105 includes a first light-emission control transistor T1 and a second light-emission control transistor T6, the gates of which are both electrically connected to a light-emission control line EML to receive a light-emitting control signal. A first electrode of the first light-emission control transistor T1 can receive a first power supply signal PVDD, and a second electrode of the first light-emission control transistor T1 can be electrically connected to the first electrode of the driving transistor T3 at a second node NO2. A first electrode of the second light-emission control transistor T6 is electrically connected to the second electrode of the driving transistor T3 at a third node NO3, and a second electrode of the second light-emission control transistor T6 is electrically connected to the first electrode of the light-emitting element LED. A second electrode of the light-emitting element LED receives a second power supply signal PVEE.

It should be noted that the first light-emission control transistor T1 and the second light-emission control transistor T6 can be P-type transistors or N-type transistors. The type of transistor can be configured according to actual needs, which is not limited by embodiments of the present disclosure.

In another embodiment, refer to FIG. 24, the pixel P also includes a storage capacitor Cst, where a first plate of the storage capacitor Cst receives a first power signal PVDD, and a second plate of the storage capacitor Cst is electrically connected to the gate of the driving transistor T3 to store the data signal written to the gate of the driving transistor T3.

Figure 25:
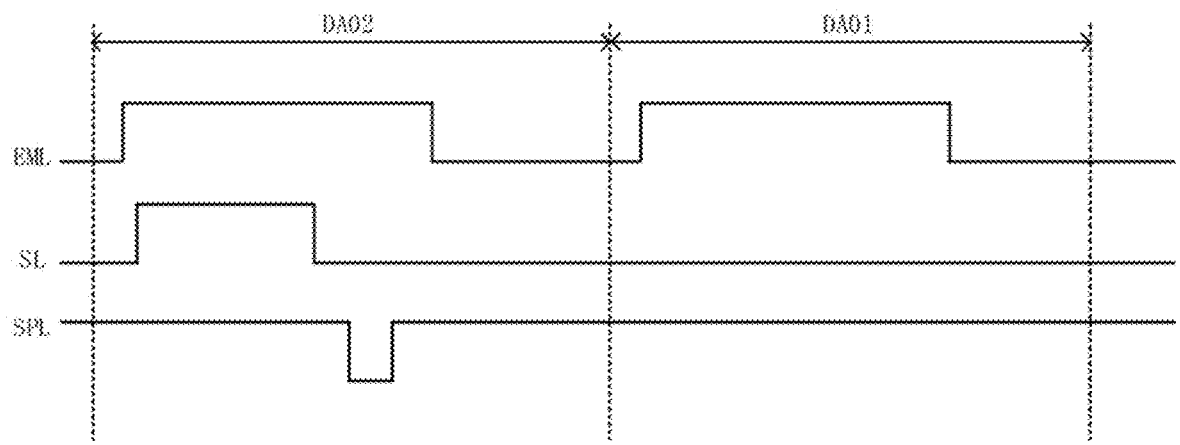
FIG. 25 is a timing diagram of a pixel located in a low-frequency display area in accordance with an embodiment of the present disclosure.

FIG. 25 is a timing diagram of a pixel located in a low-frequency display area in accordance with an embodiment of the present disclosure. Refer to FIG. 24 and FIG. 25, in the second display frame DA02 of the multi-frequency driving mode, the signals on the light-emission control line EML, the scanning line SL and the refresh control line SPL connected to the pixels P located in the low-frequency display area can jump normally. When the first light-emission control transistor T1 and the second light-emission control transistor T6 are turned off, the initialization transistor T5 and the writing transistor T2 can be turned on in sequence to implement the initialization and data writing of the gate of the driving transistor T3, so that the pixels P located in the low-frequency display area can be refreshed in the second display frame DA02. In the first display frame DA01 of the multi-frequency driving mode, the signal on the light-emission control line EML connected to the pixels P located in the low-frequency display area can jump normally, but the signals on the scanning line SL and the refresh control line SPL are always at an invalid level, and the initialization transistor T5 and the writing transistor T2 are always in the off state to stop the initialization and data writing of the gate of the driving transistor T3, so that the pixels P located in the low-frequency display area can stop refreshing in the first display frame DA01 to implement zone-by-zone frequency refresh.

Figure 26:
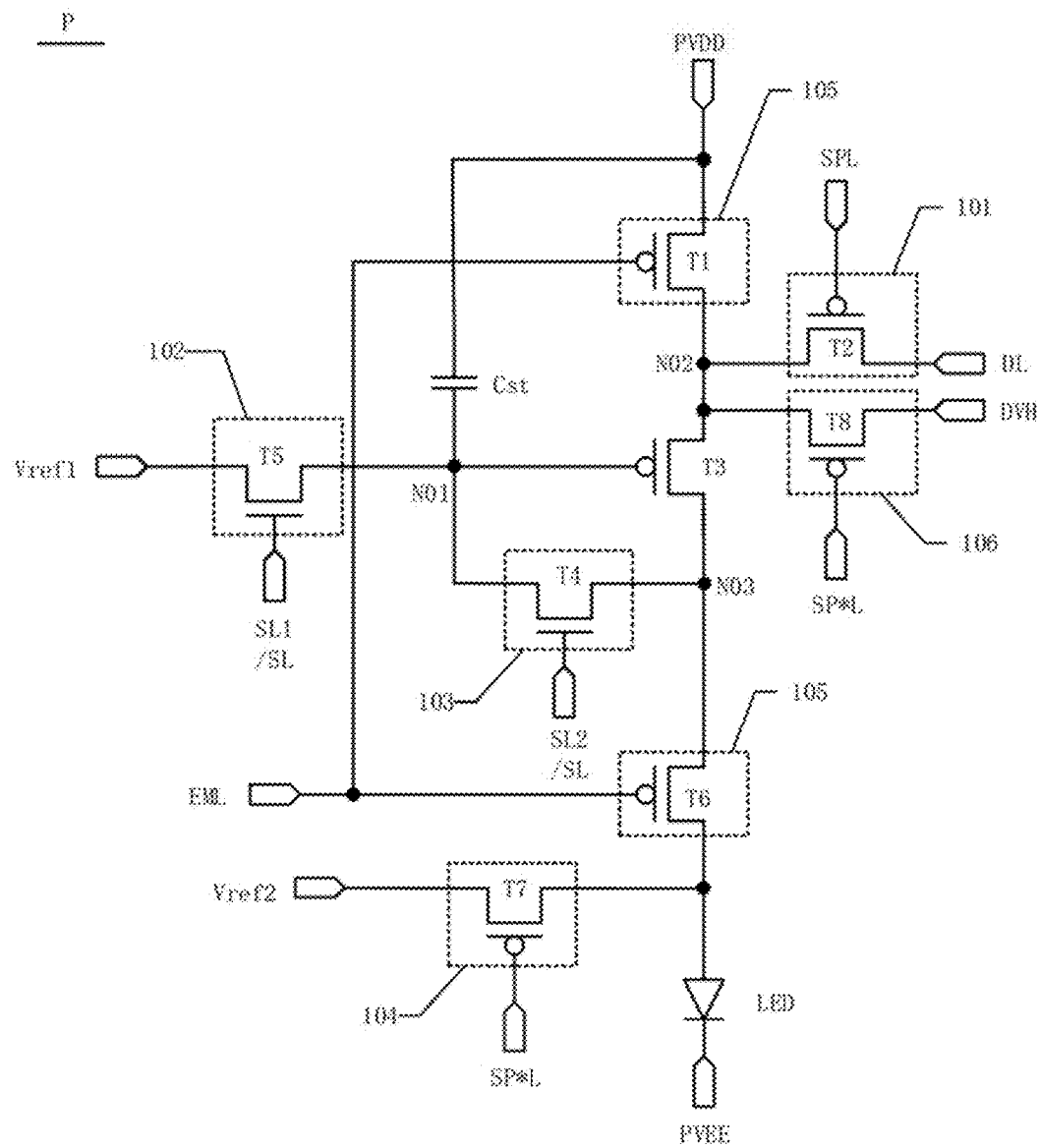
FIG. 26 is a schematic diagram of a circuit of another pixel in accordance with an embodiment of the present disclosure.

In another embodiment, FIG. 26 is a circuit structure diagram of another pixel in accordance with an embodiment of the present disclosure. Refer to FIG. 26, the pixel P also includes a threshold compensation module 103. The threshold compensation module 103 is electrically connected to the driving transistor T3. The threshold compensation module 103 is configured to receive a scanning signal GOUT, and according to the scanning signal GOUT, compensate the threshold voltage of the driving transistor T3 to the gate of the driving transistor T3.

Exemplarily, the writing module 101 includes a writing transistor T2, where the first electrode of the writing transistor T2 is electrically connected to the data line DL, and receives the data signal. The second electrode of the writing transistor T2 is electrically connected to the first electrode of the driving transistor T3 at the second node NO2. The gate of the writing transistor T2 can be electrically connected to the refresh control line SPL, and receives the refresh control signal. The threshold compensation module 103 includes a threshold compensation transistor T4, where the first electrode of the threshold compensation transistor T4 is electrically connected to the gate of the driving transistor T3 at the first node N01. The second electrode of the threshold compensation transistor T4 is electrically connected to the second electrode of the driving transistor T3 at the third node NO3. The gate of the threshold compensation transistor T4 can be electrically connected to the scanning line SL, and receives the scanning signal GOUT. That is, the scanning signal GOUT output by the shift register unit 20 provided in the embodiments of the present disclosure can control the conduction or closing of the threshold compensation transistor T4 in the pixel P. By improving the stability of the scanning signal GOUT, the fluctuation of the scanning signal GOUT which causes the threshold compensation transistor T4 to be mis-turned on or mis-turned off can be avoided.

Figure 27:
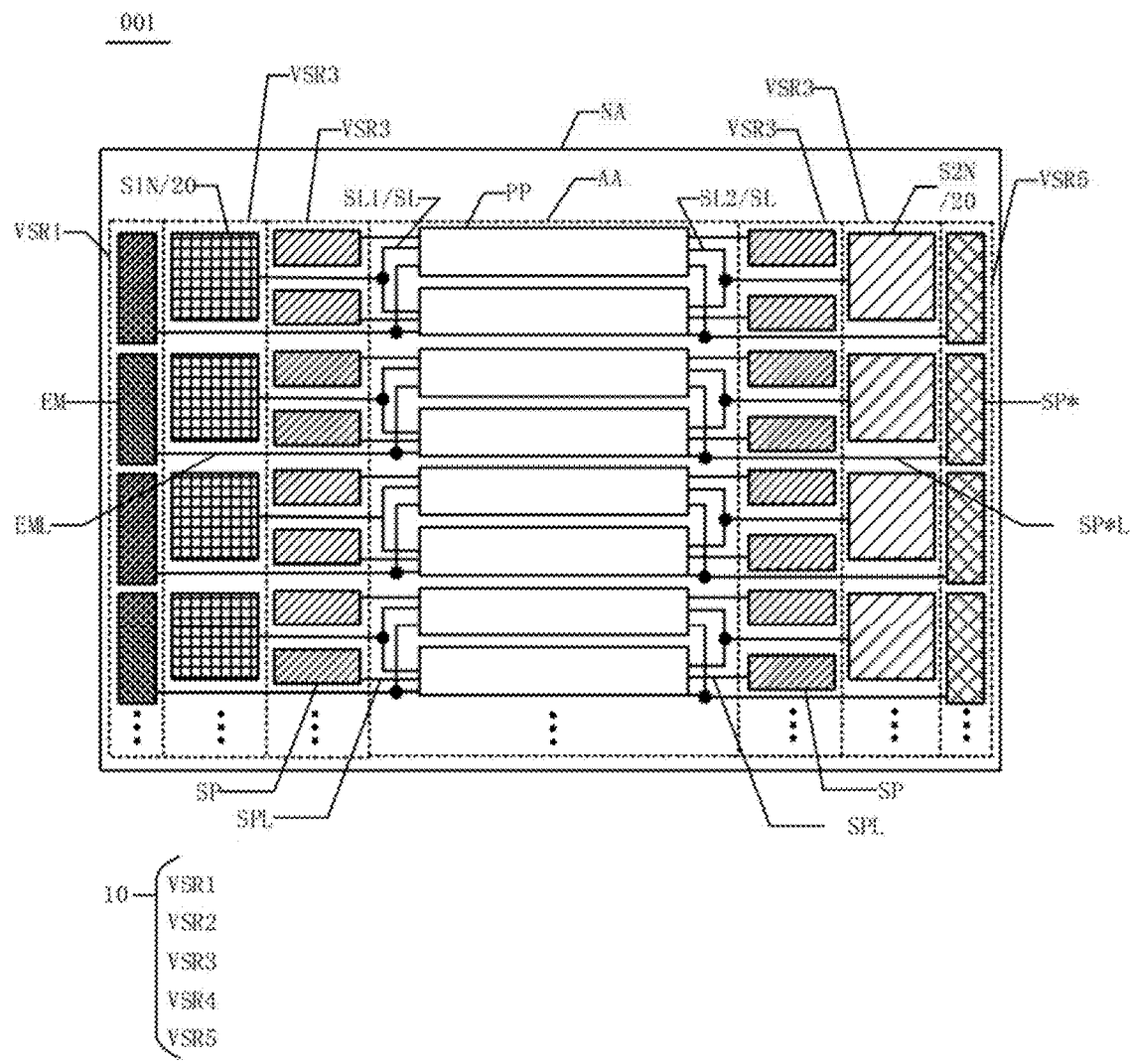
FIG. 27 is a schematic diagram of a top view of another display panel in accordance with an embodiment of the present disclosure.

If the pixel P also includes an initialization module 102, the initialization module 102 includes an initialization transistor T5. A first electrode of the initialization transistor T5 receives an initialization signal Vref1, a second electrode of the initialization transistor T5 is electrically connected to a gate of the driving transistor T3 at a first node N01, and a gate of the initialization transistor T5 can also be electrically connected to a scanning line SL to receive a scanning signal GOUT. However, the initialization transistor T5 and the threshold compensation transistor T4 of the same pixel P are connected to different scanning lines SL, and the scanning signals GOUT received by the two are different. FIG. 27 is a schematic diagram of a top view of another display panel in accordance with an embodiment of the present disclosure. Refer to FIG. 27, the driving circuit 10 may include a second shift register VSR2 and a fourth shift register VSR4. The second shift register VSR2 includes a plurality of cascaded initialization shift registers S1N. The initialization shift register S1N can be electrically connected to the gate of the initialization transistor T5 in the pixel row PP through the first scan line SL1 to provide a first scan signal GOUT1. A fourth shift register VSR4 includes a plurality of cascaded compensation shift registers S2N. The compensation shift register S2N can be electrically connected to the gate of the threshold compensation transistor T4 in the pixel row PP through the second scan line SL2 to provide a second scan signal GOUT2. The second shift register VSR2 and the fourth shift register VSR4 may both include the shift register unit 20 provided in the embodiments of the present disclosure. The second shift register VSR2 and the fourth shift register VSR4 receive different start signals, so that the first scan signal GOUT1 and the second scan signal GOUT2 are different. By improving the stability of the first scan signal GOUT1 and the second scan signal GOUT2, the initialization transistor T5 and the threshold compensation transistor T4 can be avoided from being mis-turned on or mis-turned off.

Moreover, the driving circuit 10 may also include a first shift register VSR1 and a third shift register VSR3. The first shift register VSR1 includes a plurality of cascaded light-emission control shift register units EM. A light-emission control shift register unit EM can be electrically connected to the gates of the light-emission control transistors (T1, T6) in the pixel row PP through the light-emission control line EML to provide a light-emission control signal. Third shift register VSR3 includes a plurality of cascaded refresh control shift register units SP. A refresh control shift register unit SP can be electrically connected to the gate of the writing transistor T2 in the pixel row PP through the refresh control line SPL to provide a refresh control signal.

In another embodiment, refer further to FIG. 26 and FIG. 27, the pixel P may further include a reset module 104 and a bias module 106, where the reset module 104 is configured to reset the light-emitting element LED, and the bias module 106 is configured to bias the driving transistor T3. The reset module 104 includes a reset transistor T7, and the bias module 106 includes a bias transistor T8, where a first electrode of the reset transistor T7 receives a reset signal Vref2, a second electrode of the reset transistor T7 is electrically connected to a first electrode of the light-emitting element LED, a first electrode of the bias transistor T8 receives a bias signal DVH, a second electrode of the bias transistor T8 is electrically connected to the driving transistor T3, and the gates of the reset transistor T7 and the bias transistor T8 are both electrically connected to a bias control line SP*L to receive a bias control signal. The driving circuit 10 may further include a fifth shift register VSR5, which includes a plurality of cascaded bias control shift register units SP*. A bias control shift register unit SP* may be electrically connected to the gates of the reset transistor T7 and the bias transistor T8 in the pixel row PP via a bias control line SP*L to provide a bias control signal.

Figure 28:
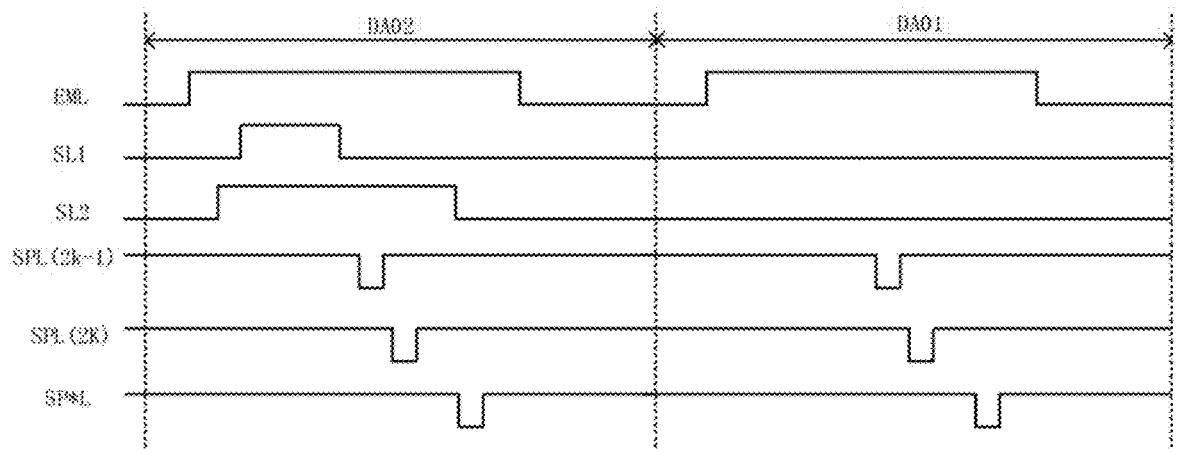
FIG. 28 is a timing diagram of another pixel located in a low-frequency display area in accordance with an embodiment of the present disclosure.

FIG. 28 is another timing diagram of a pixel located in a low-frequency display area in accordance with an embodiment of the present disclosure. Refer to FIG. 26 to FIG. 28, in the second display frame DA02 of the multi-frequency driving mode, the signals on the light-emission control line EML, the first scan line SL1, the second scan line SL2, the refresh control line SPL and the bias control line SP*L connected to the pixels P located in the low-frequency display area can all jump normally. When the first light-emission control transistor T1 and the second light-emission control transistor T6 are turned off, the threshold compensation transistor T4, the initialization transistor T5, the writing transistor T2, the reset transistor T7 and the bias transistor T8 can be turned on respectively to implement the initialization of the gate of the driving transistor T3, data writing, threshold compensation, bias adjustment, and resetting of the light-emitting element LED, so that the pixel Ps located in the low-frequency display area can be refreshed in the second display frame DA02. In the first display frame DA01 of the multi-frequency driving mode, the signals on the light-emission control line EML, the refresh control line SPL and the bias control line SP*L connected to the pixels P located in the low-frequency display area can jump normally, but the signals on the first scanning line SL1 and the second scanning line SL2 are always at an invalid level, and the initialization transistor T5 and the threshold compensation transistor T4 are always in the off state to stop the initialization and data writing to the gate of the driving transistor T3, so that the pixels P located in the low-frequency display area can stop refreshing in the first display frame DA01 to achieve zoned and frequency-controlled refresh.

Figure 29:
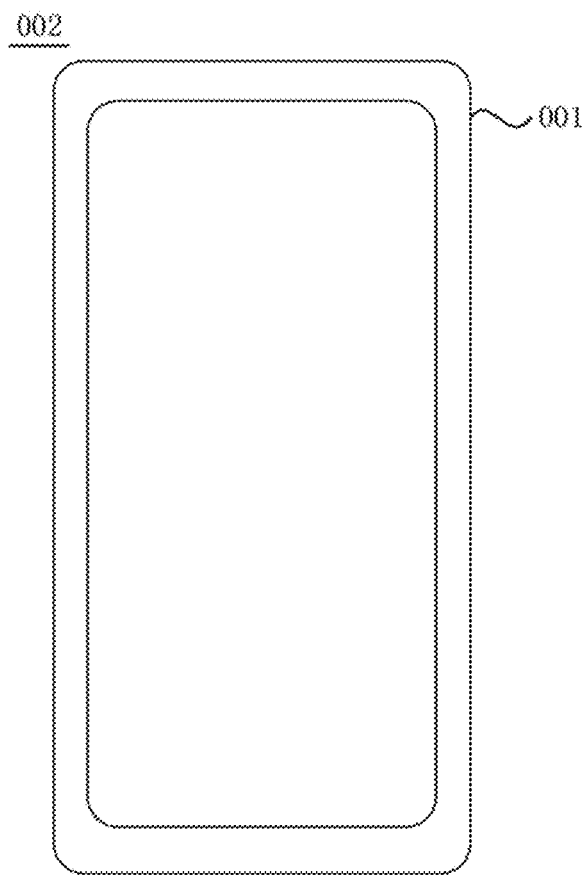
FIG. 29 is a schematic diagram of a display device in accordance with an embodiment of the present disclosure.

Based on the same inventive concept, an embodiment of the present disclosure further provides a display device. FIG. 29 is a schematic diagram of a display device in accordance with an embodiment of the present disclosure. As shown in FIG. 29, a display device 002 includes a display panel 001 provided by any embodiment of the present disclosure. The display device 002 provided by an embodiment of the present disclosure may be a mobile phone as shown in FIG. 29, or it may be any electronic product with a display function, including but not limited to the following categories: televisions, laptops, desktop displays, tablet computers, digital cameras, smart bracelets, smart glasses, vehicle-mounted displays, medical equipment, industrial control equipment, touch interactive terminals, etc., and is not specifically limited by the embodiments of the present disclosure.

The technical solutions of the present disclosure can implement the sequential driving of the shift register unit by configuring a driving control module and a scanning module in the shift register unit. The signal of the third output node can be controlled by configuring a transmission control module. Under the control of the transmission control signal, the scanning signal can be asynchronous with the stage transfer signal. In some display frames, the scanning signal received by the pixels in some areas may always be at an invalid level, and some pixels are controlled to stop refreshing, so as to implement the partitioning and frequency division of the display panel to reduce the power consumption of the display panel. The signal of the fourth output node can be controlled by setting an auxiliary control module. Under the control of the signal of the second output node, the signal of the third output node, and the auxiliary control signal, the auxiliary control module can control the signal of the fourth output node to be at a valid level at least part of the time when the stage transfer signal is at a valid level but the signal of the third output node is at an invalid level, so that the scanning module can control the scanning signal to be at a second level. This improves the stability of the scanning signal, avoids the scanning signal floating, and avoids large fluctuations due to the influence of parasitic capacitance, thereby affecting the display effect.

It should be noted that the above are merely some embodiments of the present disclosure and the technical principles used. Persons skilled in the art will understand that the present disclosure is not limited to the specific embodiments described herein, and that various obvious changes, readjustments and substitutions can be made by persons skilled in the art without departing from the scope of protection of the present disclosure. Therefore, although the present disclosure has been described in more detail through the above embodiments, the present disclosure is not limited to the above embodiments, and may further include other equivalent embodiments without departing from the concept of the present disclosure, and the scope of the present disclosure is determined by the scope of the appended claims.

What is claimed is:

1. A display panel, comprising:
   a driving circuit including a plurality of cascaded shift register units, wherein a shift register unit includes a driving control module, a stage transfer module, a transmission control module, an auxiliary control module and a scanning module, wherein:
   the driving control module is configured to receive at least an input signal and control a signal of a first output node and a signal of a second output node;
   the stage transfer module is configured to receive at least the signal of the first output node and the signal of the second output node, and control a stage transfer signal, wherein a stage transfer signal of an i-th stage shift register unit is multiplexed as an input signal of a j-th stage shift register unit, wherein i≠j, and i and j are both positive integers;
   the transmission control module is configured to receive at least the stage transfer signal and a transmission control signal, and control a signal of a third output node;
   the auxiliary control module is configured to receive at least the signal of the second output node, the signal of the third output node and an auxiliary control signal, and control a signal of a fourth output node; and
   the scanning module is configured to receive at least the signal of the third output node and the signal of the fourth output node, and control a scanning signal.

2. The display panel according to claim 1, wherein:
   the scanning module includes a first scanning transistor and a second scanning transistor;
   a gate of the first scanning transistor is electrically connected to the third output node, a first electrode of the first scanning transistor receives a first level signal, and a second electrode of the first scanning transistor is configured to output the scanning signal; and
   a gate of the second scanning transistor is electrically connected to the fourth output node, a first electrode of the second scanning transistor receives a second level signal, and a second electrode of the second scanning transistor is configured to output the scanning signal.

3. The display panel according to claim 2, wherein:
the scanning module further includes an auxiliary output transistor, wherein a gate of the auxiliary output transistor is electrically connected to the second output node, a first electrode of the auxiliary output transistor receives the second level signal, and a second electrode of the auxiliary output transistor is configured to output the scanning signal.

4. The display panel according to claim 1, wherein:
the stage transfer module includes a first level transfer transistor and a second level transfer transistor;
a gate of the first level transfer transistor is electrically connected to the first output node, a first electrode of the first level transfer transistor receives a first level signal, and a second electrode of the first level transfer transistor is configured to output the stage transfer signal; and
a gate of the second level transfer transistor is electrically connected to the second output node, a first electrode of the second level transfer transistor receives a second level signal, and a second electrode of the second level transfer transistor is configured to output the stage transfer signal.

5. The display panel according to claim 1, wherein:
the display panel includes a multi-frequency driving mode, and at least part of display frames of the multi-frequency driving mode are first display frames, wherein a first display frame includes a refresh phase and a holding phase;
the driving circuit includes at least one first shift register unit; and
in the holding phase, the transmission control signal is at a non-enabling level, the stage transfer signal output by the first shift register unit includes a first level, and the scanning signal is at a second level.

6. The display panel according to claim 5, wherein:
in the holding phase, when the stage transfer signal output by a same first shift register unit is at the first level and the scanning signal is at the second level, the signal of the first output node is at a valid level, and the signal of the second output node and the signal of the third output node are at an invalid level; and
in the holding phase, for at least part of the time when the stage transfer signal output by the same first shift register unit is at the first level and the scanning signal is at the second level, the signal of the fourth output node is at the valid level.

7. The display panel according to claim 5, wherein:
the driving circuit further includes at least one second shift register unit; and
in the refresh phase, the transmission control signal is at an enabling level, and the stage transfer signal and the scanning signal output by a second shift register unit both include the first level.

8. The display panel according to claim 7, wherein:
in the refresh phase, when the stage transfer signal and the scanning signal output by a same second shift register unit are both at the first level, the signal of the first output node and the signal of the third output node are both at a valid level, and the signal of the second output node and the signal of the fourth output node are both at an invalid level.

9. The display panel according to claim 7, wherein:
part of the display frames of the multi-frequency driving mode are second display frames;
in a second display frame, the stage transfer signal and the scanning signal of the first shift register unit both include the first level, and the stage transfer signal and the scanning signal of the second shift register unit both include the first level; and
the multi-frequency driving mode includes a plurality of display cycles, wherein a display cycle includes at least one first display frame and at least one second display frame, and the at least one second display frame is located before the at least one first display frame.

10. The display panel according to claim 1, wherein:
the auxiliary control module includes a first auxiliary control unit and a second auxiliary control unit;
the first auxiliary control unit is configured to receive the signal of the third output node and a first fixed signal, and control the signal of the fourth output node, wherein a level of the first fixed signal is an invalid level of the fourth output node; and
the second auxiliary control unit is configured to receive the auxiliary control signal and the signal of the second output node, and control the signal of the fourth output node.

11. The display panel according to claim 10, wherein:
the first auxiliary control unit includes a first auxiliary transistor; and
a gate of the first auxiliary transistor is electrically connected to the third output node, a first electrode of the first auxiliary transistor receives the first fixed signal, and a second electrode of the first auxiliary transistor is electrically connected to the fourth output node.

12. The display panel according to claim 10, wherein:
the second auxiliary control unit includes a second auxiliary transistor; and
a gate of the second auxiliary transistor receives the auxiliary control signal, a first electrode of the second auxiliary transistor is electrically connected to the second output node, and a second electrode of the second auxiliary transistor is electrically connected to the fourth output node.

13. The display panel according to claim 12, wherein:
the second auxiliary control unit further includes an auxiliary storage capacitor; and
a first plate of the auxiliary storage capacitor receives a fixed signal, and a second plate of the auxiliary storage capacitor is electrically connected to the fourth output node.

14. The display panel according to claim 10, wherein:
in a same shift register unit, a valid duration of the auxiliary control signal overlaps with a valid duration of the signal of the second output node;
the signal of the second output node and the auxiliary control signal both include a first transition edge from a valid level to an invalid level, and a second transition edge from an invalid level to a valid level; and
in the same shift register unit, the first transition edge of the signal of the second output node is located between the first transition edge and the second transition edge of the auxiliary control signal.

15. The display panel according to claim 14, wherein, in the same shift register unit, an invalid duration of the auxiliary control signal overlaps with a valid duration of the first output node.

16. The display panel according to claim 14, wherein the auxiliary control signal of a j-th stage shift register unit multiplexes the signal of the second output node of an i-th stage shift register unit, i≠j, and i and j are both positive integers.

17. The display panel according to claim 1, wherein:
the transmission control module includes a pull-up unit, a pull-down control unit and a pull-down unit;
the pull-up unit is configured to receive the stage transfer signal and a first fixed signal, and control the signal of the third output node;
the pull-down control unit is configured to receive the stage transfer signal and the transmission control signal, and control a signal of a pull-down control node; and
the pull-down unit is configured to receive the stage transfer signal, the signal of the pull-down control node and a second fixed signal, and control the signal of the third output node.

18. The display panel according to claim 17, wherein:
the pull-down control unit includes a pull-down control transistor; and
a gate of the pull-down control transistor receives the stage transfer signal, a first electrode of the pull-down control transistor receives the transmission control signal, and a second electrode of the pull-down control transistor is electrically connected to the pull-down control node.

19. The display panel according to claim 18, wherein:
the pull-up unit includes a pull-up transistor; and
a gate of the pull-up transistor receives the stage transfer signal, a first electrode of the pull-up transistor receives the first fixed signal, and a second electrode of the pull-up transistor is electrically connected to the third output node.

20. The display panel according to claim 19, wherein:
the pull-down unit includes a pull-down transistor and a gate transistor; and
a gate of the pull-down transistor receives the stage transfer signal, a first electrode of the pull-down transistor receives the second fixed signal, a second electrode of the pull-down transistor is electrically connected to a first electrode of the gate transistor, a gate of the gate transistor is electrically connected to the pull-down control node, and a second electrode of the gate transistor is electrically connected to the third output node,
wherein, a channel type of the pull-up transistor is opposite to a channel type of the pull-down transistor.

21. The display panel according to claim 20, wherein:
the pull-up unit further includes a pull-up auxiliary transistor; and
a gate of the pull-up auxiliary transistor is electrically connected to the pull-down control node, a first electrode of the pull-up auxiliary transistor receives the first fixed signal, and a second electrode of the pull-up auxiliary transistor is electrically connected to the third output node,
wherein, a channel type of the pull-up auxiliary transistor is opposite to a channel type of the gate transistor.

22. The display panel according to claim 17, wherein:
the transmission control module further includes a first storage capacitor; and
a first plate of the first storage capacitor receives a fixed signal, and a second plate of the first storage capacitor is electrically connected to the third output node.

23. The display panel according to claim 17, wherein:
the transmission control module further includes a second storage capacitor; and
a first plate of the second storage capacitor receives a fixed signal, and a second plate of the second storage capacitor is electrically connected to the pull-down control node.

24. The display panel according to claim 1, wherein:
the driving control module includes a first driving unit and a second driving unit;
the first driving unit is configured to receive the signal of the second output node, a first fixed signal, a second fixed signal, a first clock signal and a second clock signal, and control the signal of the first output node; and
the second driving unit is configured to receive the input signal and the first clock signal, and control the signal of the second output node.

25. The display panel according to claim 24, wherein:
the first driving unit includes a first sub-unit and a second sub-unit;
the first sub-unit receives the signal of the second output node, the first clock signal and the second fixed signal, and controls a signal of a driving node; and
the second sub-unit receives the signal of the second output node, the signal of the driving node, the second clock signal, and the first fixed signal, and controls the signal of the first output node.

26. The display panel according to claim 25, wherein:
the first sub-unit includes a first driving transistor and a second driving transistor;
a gate of the first driving transistor receives the first clock signal, a first electrode of the first driving transistor receives the second fixed signal, and a second electrode of the first driving transistor and a second electrode of the second driving transistor are electrically connected to the driving node; and
a gate of the second driving transistor is electrically connected to the second output node, and a first electrode of the second driving transistor receives the first clock signal.

27. The display panel according to claim 25, wherein:
the second sub-unit includes a second bootstrap capacitor, a third driving transistor, a fourth driving transistor and a fifth driving transistor;
a first plate of the second bootstrap capacitor and a gate of the third driving transistor are electrically connected to the driving node, a first electrode of the third driving transistor receives the second clock signal, and a second electrode of the third driving transistor is electrically connected to a second plate of the second bootstrap capacitor and a first electrode of the fourth driving transistor;
a gate of the fourth driving transistor receives the second clock signal, and a second electrode of the fourth driving transistor and a second electrode of the fifth driving transistor are electrically connected to the first output node; and
a gate of the fifth driving transistor is electrically connected to the second output node, and a first electrode of the fifth driving transistor receives the first fixed signal.

28. The display panel according to claim 24, wherein:
the second driving unit includes an input sub-unit; and
the input sub-unit is configured to receive the input signal and the first clock signal, and control the signal of the second output node.

39

29. The display panel according to claim 28, wherein:
the input sub-unit includes a first input transistor; and
a gate of the first input transistor receives the first clock signal, a first electrode of the first input transistor receives the input signal, and a second electrode of the first input transistor is electrically connected to the second output node.

30. The display panel according to claim 28, wherein:
the second driving unit further includes a pull-down auxiliary sub-unit;
the input sub-unit is further configured to receive the input signal and the first clock signal, and control a signal of an input node; and
the pull-down auxiliary sub-unit is configured to receive the signal of the input node and the second clock signal, and control the signal of the second output node.

31. The display panel according to claim 30, wherein:
the input sub-unit includes a second input transistor;
a gate of the second input transistor receives the first clock signal, a first electrode of the second input transistor receives the input signal, and a second electrode of the second input transistor is electrically connected to the input node;
the pull-down auxiliary sub-unit includes a first pull-down auxiliary transistor, a second pull-down auxiliary transistor and a first bootstrap capacitor;
a gate of the first pull-down auxiliary transistor and a first electrode of the first pull-down auxiliary transistor are both electrically connected to the input node, and a second electrode of the first pull-down auxiliary transistor is electrically connected to the second output node;
a gate of the second pull-down auxiliary transistor is electrically connected to the input node, a first electrode of the second pull-down auxiliary transistor receives the second clock signal, a second electrode of the second pull-down auxiliary transistor is electrically connected to a first plate of the first bootstrap capacitor, and a second plate of the first bootstrap capacitor is electrically connected to the input node.

32. The display panel according to claim 31, wherein:
the pull-down auxiliary sub-unit further includes a third pull-down auxiliary transistor; and
a gate of the third pull-down auxiliary transistor is electrically connected to the first driving unit, a first electrode of the third pull-down auxiliary transistor receives the first fixed signal, and a second electrode of the third pull-down auxiliary transistor is electrically connected to the first electrode plate of the first bootstrap capacitor.

33. The display panel according to claim 1, wherein:
the display panel further includes a plurality of pixels and a plurality of scan lines arranged in an array, and at least part of pixels in a same row are electrically connected to a same scan line; and
the scanning module of the shift register unit is electrically connected to at least two scanning lines.

40

34. The display panel according to claim 1, wherein:
the display panel further includes a plurality of pixels arranged in an array, a pixel including a driving transistor, a writing module, an initialization module and a light-emitting element;
the initialization module and the writing module are electrically connected to the driving transistor respectively;
the initialization module is configured to receive at least the scanning signal, and initialize a gate of the driving transistor according to the scanning signal; and
the writing module is configured to write a data signal into the gate of the driving transistor.

35. The display panel according to claim 1, wherein:
the display panel further includes a plurality of pixels arranged in an array, a pixel including a driving transistor, a writing module, a threshold compensation module, a light-emission control module and a light-emitting element;
the writing module, the threshold compensation module and the light-emission control module are electrically connected to the driving transistor respectively;
the writing module is configured to write a data signal into a gate of the driving transistor;
the threshold compensation module is configured to receive the scanning signal, and compensate a threshold voltage of the driving transistor to the gate of the driving transistor according to the scanning signal; and
the light-emission control module is configured to control the driving transistor to provide a driving current to the light-emitting element.

36. A display device, including a display panel, and the display panel comprising:
a driving circuit including a plurality of cascaded shift register units, wherein a shift register unit includes a driving control module, a stage transfer module, a transmission control module, an auxiliary control module and a scanning module, wherein:
the driving control module is configured to receive at least an input signal and control a signal of a first output node and a signal of a second output node;
the stage transfer module is configured to receive at least the signal of the first output node and the signal of the second output node, and control a stage transfer signal, wherein a stage transfer signal of an i-th stage shift register unit is multiplexed as an input signal of a j-th stage shift register unit, wherein i≠j, and i and j are both positive integers;
the transmission control module is configured to receive at least the stage transfer signal and a transmission control signal, and control a signal of a third output node;
the auxiliary control module is configured to receive at least the signal of the second output node, the signal of the third output node and an auxiliary control signal, and control a signal of a fourth output node; and
the scanning module is configured to receive at least the signal of the third output node and the signal of the fourth output node, and control a scanning signal.

* * * * *